(12) United States Patent
Kim et al.

(10) Patent No.: US 12,041,191 B2
(45) Date of Patent: Jul. 16, 2024

(54) ANTENNA AND ELECTRONIC APPARATUS INCLUDING SAME

(71) Applicant: Samsung Electronics Co., Ltd., Suwon-si (KR)

(72) Inventors: Yongyoun Kim, Suwon-si (KR); Jaesung Shim, Suwon-si (KR); Myeongsu Oh, Suwon-si (KR); Hojin Jung, Suwon-si (KR); Duho Chu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 340 days.

(21) Appl. No.: 17/426,892

(22) PCT Filed: Jan. 2, 2020

(86) PCT No.: PCT/KR2020/000028
§ 371 (c)(1),
(2) Date: Jul. 29, 2021

(87) PCT Pub. No.: WO2020/166821
PCT Pub. Date: Aug. 20, 2020

(65) Prior Publication Data
US 2022/0103668 A1    Mar. 31, 2022

(30) Foreign Application Priority Data
Feb. 13, 2019   (KR) .................. 10-2019-0016491

(51) Int. Cl.
*H04M 1/02* (2006.01)
*H05K 1/02* (2006.01)
(Continued)

(52) U.S. Cl.
CPC ....... *H04M 1/0214* (2013.01); *H04M 1/0268* (2013.01); *H05K 1/0213* (2013.01);
(Continued)

(58) Field of Classification Search
CPC ............ H01Q 1/52; H01Q 1/243; H01Q 1/44; H01Q 5/335; H01Q 5/371; H01Q 9/42;
(Continued)

(56) References Cited

U.S. PATENT DOCUMENTS

| 10,361,478 | B2 * | 7/2019 | Ma ........................... B23B 1/00 |
| 2012/0121117 | A1 * | 5/2012 | Kim ........................ H04M 1/03 361/752 |

(Continued)

FOREIGN PATENT DOCUMENTS

| CN | 103236583 A | 8/2013 |
| CN | 103296385 A | 9/2013 |

(Continued)

OTHER PUBLICATIONS

Korean Office Action dated Mar. 15, 2023, issued in Korean Application No. 10-2019-0016491.

(Continued)

*Primary Examiner* — Tan H Trinh
(74) *Attorney, Agent, or Firm* — Jefferson IP Law, LLP

(57) ABSTRACT

An electronic apparatus is provided. The electronic apparatus includes a housing which comprises a front surface plate, a rear surface plate oriented in the opposite direction to the front surface plate, and a side surface member surrounding the space between the front surface plate and the rear surface plate, at least a portion of the side surface member including at least one conductive section positioned between a first non-conductive section and a second non-conductive section which are spaced apart from each other, a conductive extended portion part extending from at least a partial area of the conductive section to the space, a printed circuit board disposed in the space, and a wireless communication circuit disposed on the printed circuit board and electrically con- (Continued)

nected a point which is in the conductive section and spaced toward a first location from the first non-conductive section.

12 Claims, 21 Drawing Sheets

(51) Int. Cl.
*H05K 5/00* (2006.01)
*H05K 5/02* (2006.01)
*H05K 7/14* (2006.01)

(52) U.S. Cl.
CPC ......... *H05K 5/0017* (2013.01); *H05K 5/0217* (2013.01); *H05K 7/1427* (2013.01)

(58) Field of Classification Search
CPC .... H04M 1/02; H04M 1/0214; H04M 1/0216; H04M 1/026; H04M 1/0268; H04M 1/0277; H04B 1/40; H05K 1/0213; H05K 5/0017; H05K 5/0217; H05K 7/1427
USPC ...................................... 455/575.3
See application file for complete search history.

(56) References Cited

U.S. PATENT DOCUMENTS

| | | | |
|---|---|---|---|
| 2012/0218723 A1* | 8/2012 | Kwak | ................ H01Q 7/00 361/748 |
| 2015/0155616 A1 | 6/2015 | Lin | |
| 2015/0188213 A1 | 7/2015 | Lin | |
| 2016/0352015 A1 | 12/2016 | Roh et al. | |
| 2017/0222304 A1* | 8/2017 | Xue | .......................... H01Q 1/38 |
| 2017/0302771 A1 | 10/2017 | Kim et al. | |
| 2017/0346164 A1* | 11/2017 | Kim | ..................... H04M 1/0266 |
| 2019/0140342 A1* | 5/2019 | Lim | ....................... H01Q 5/335 |
| 2019/0252766 A1* | 8/2019 | Jeon | ..................... H04M 1/0262 |
| 2019/0341688 A1* | 11/2019 | Kim | ....................... H01Q 1/243 |
| 2020/0076057 A1* | 3/2020 | Leutheuser | .......... H05K 5/0247 |
| 2020/0412022 A1* | 12/2020 | Yun | ........................ H01Q 21/22 |

FOREIGN PATENT DOCUMENTS

| | | | |
|---|---|---|---|
| CN | 104852122 A | 8/2015 | |
| CN | 108123210 A | 6/2018 | |
| CN | 108702403 A | 10/2018 | |
| EP | 3 200 274 A1 | 8/2017 | |
| JP | 2013-197852 A | 9/2013 | |
| KR | 10-1580546 B1 | 12/2015 | |
| KR | 10-2016-0139474 A | 12/2016 | |
| KR | 10-2017-0120985 A | 11/2017 | |
| KR | 10-2017-0133594 A | 12/2017 | |
| KR | 10-2018-0094636 A | 8/2018 | |

OTHER PUBLICATIONS

European Search Report dated Feb. 7, 2022, issued in European Application No. 20755747.1.
Chinese Office Action dated Nov. 29, 2023, issued in Chinese Patent Application No. 202080014850.0.

* cited by examiner

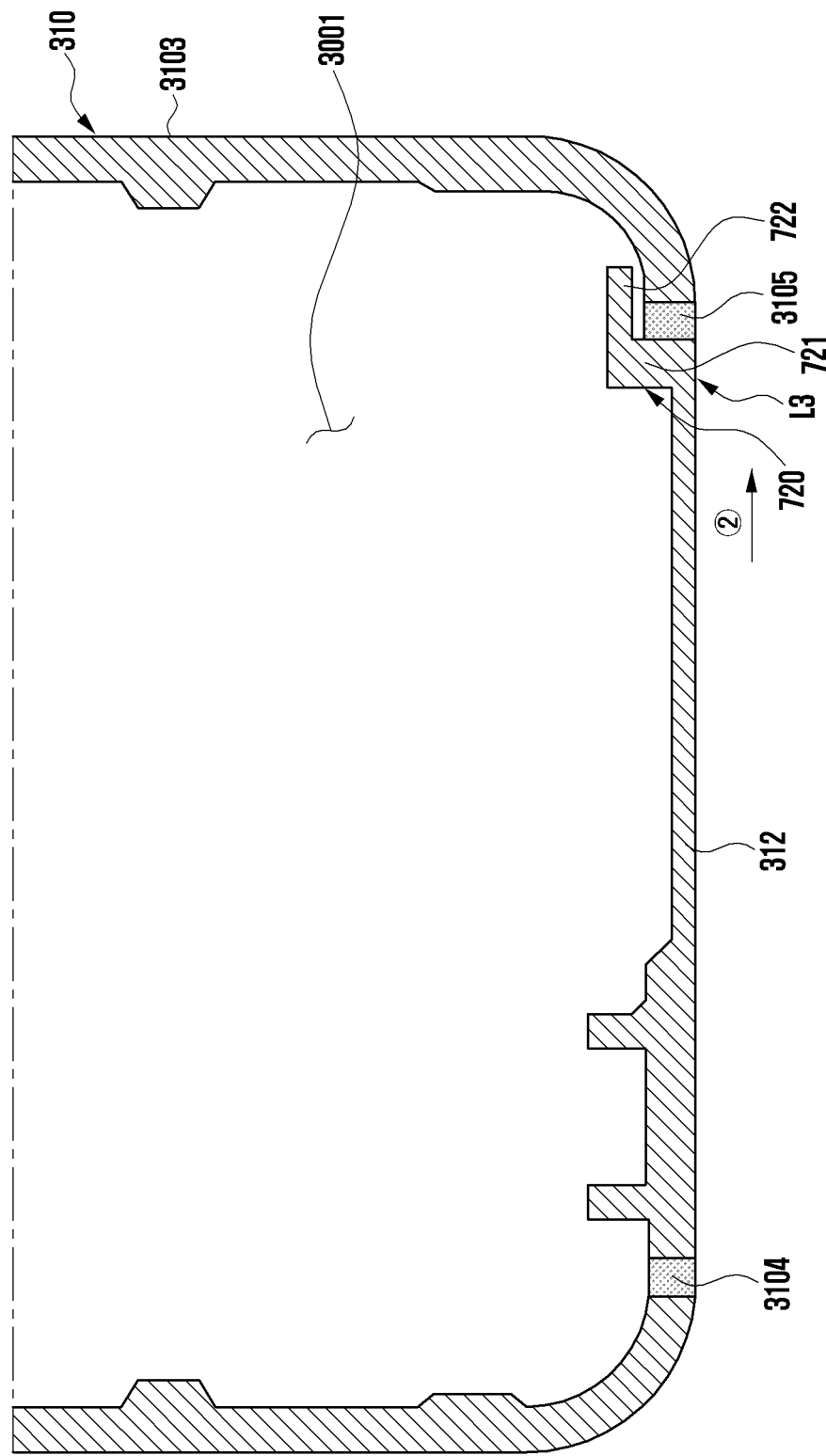

ANTENNA AND ELECTRONIC APPARATUS INCLUDING SAME

CROSS-REFERENCE TO RELATED APPLICATION(S)

This application is a U.S. National Stage application under 35 U.S.C. § 371 of an International application number PCT/KR2020/000028, filed on Jan. 2, 2020, which is based on and claims priority of a Korean patent application number 10-2019-0016491, filed on Feb. 13, 2019, in the Korean Intellectual Property Office, the disclosure of which is incorporated by reference herein in its entirety.

BACKGROUND

1. Field

The disclosure relates to an antenna and an electronic device including the same.

2. Description of Related Art

In recent years, as the functional gap between manufacturers is significantly reduced, electronic devices are gradually becoming slimmer in order to satisfy consumers' purchasing desires. On the other hand, a conductive member (e.g., a metal frame or a metal lateral bezel) may be used in at least some structures of the electronic device to increase its rigidity. In particular, in case of an electronic device for communication, at least a part of the conductive member is used as an antenna to achieve the slimmed device, and it is therefore essential to improve the radiation performance.

The above information is presented as background information only to assist with an understanding of the disclosure. No determination has been made, and no assertion is made, as to whether any of the above might be applicable as prior art with regard to the disclosure.

SUMMARY

When the exterior of the electronic device is formed of a conductive member (e.g., a metal frame or a metal bezel) in order to meet the slimming trend of the electronic device, the antenna is not designed separately unlike an injection-molded structure of a dielectric material, and at least a part of the conductive member may be used as the antenna. For example, when used as the antenna, at least a part of the conductive member used as a lateral member (e.g., a lateral bezel) of the electronic device may be segmented to form a unit conductive portion by inserting insulating portions (e.g., segments) of a dielectric material and defining a conductive portion for a power feeder interposed therebetween.

The conductive portion may not satisfy the electrical length required by the antenna according to the miniaturization and/or slimming of the electronic device. So, in order to address insufficient electrical length, a conductive extended portion (e.g., an additional pattern) may be separately disposed near the conductive portion. For example, the conductive extended portion may be a laser direct structuring (LDS) pattern formed on an antenna carrier disposed near the conductive portion, or a conductive pattern formed on a flexible printed circuit board (FPCB) or printed circuit board (PCB).

However, separate from the conductive portion, the conductive extended portion disposed near the conductive portion should use an electrical connection member (e.g., C-clip or conductive tape) and/or a conductive connection pattern of a certain length, for electrical connection with the conductive portion. Thus, even if the antenna using the conductive portion is shifted to a desired frequency band via the conductive extended portion, the radiation efficiency may be reduced in the corresponding frequency band.

Aspects of the disclosure are to address at least the above-mentioned problems and/or disadvantages and to provide at least the advantages described below. Accordingly, an aspect of the disclosure is to provide an antenna configured to exhibit excellent radiation performance in a desired frequency band, and an electronic device including the same.

Another aspect of the disclosure is to provide an antenna that is easy to change a design and does not require an additional mounting space, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate, a rear plate facing opposite to the front plate, and a lateral member surrounding a space between the front plate and the rear plate, wherein at least a part of the lateral member includes at least one conductive portion positioned between a first non-conductive portion and a second non-conductive portion which are spaced apart from each other, a conductive extended portion extended from at least a part of the conductive portion to the space, a printed circuit board disposed in the space, and a wireless communication circuit disposed on the printed circuit board and electrically connected to the conductive portion at a first location of the conductive portion spaced apart from the first non-conductive portion.

In accordance with another aspect of the disclosure, an electronic device is provided. The electronic device includes a foldable housing including a hinge module, a first housing connected to the hinge module, and including a first surface facing in a first direction, a second surface facing in a direction opposite to the first surface, and a first lateral frame surrounding a first space between the first surface and the second surface, wherein at least a part of the first lateral frame includes a conductive portion positioned between first and second non-conductive portions spaced apart from each other, and a conductive extended portion extended from at least a part of the conductive portion into the first space, and a second housing connected to the hinge module, and including a third surface facing in a second direction, a fourth surface facing in a direction opposite to the third surface, and a second lateral frame surrounding a second space between the third surface and the fourth surface, wherein the first housing and the second housing are foldable with respect to each other along the hinge module so that, in a folded state, the first surface faces the third surface and, in an unfolded state, the second direction is identical with the first direction, a flexible display extended from the first surface to the third surface, a printed circuit board disposed in the first space, and a wireless communication circuit disposed on the printed circuit board and electrically connected to the conductive portion at a first location of the conductive portion spaced apart from the first non-conductive portion.

In various embodiments of the disclosure, frequency shift is possible in a relatively wide band through a conductive extended portion integrally extended from a conductive portion used as an antenna without degradation in radiation performance. No additional mounting space is required for the conductive extended portion, so it is possible to contribute to the slimming of the electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A, 7B, 7C, 7D, and 7E are diagrams illustrating the configuration of a conductive extended portion according to various embodiments of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
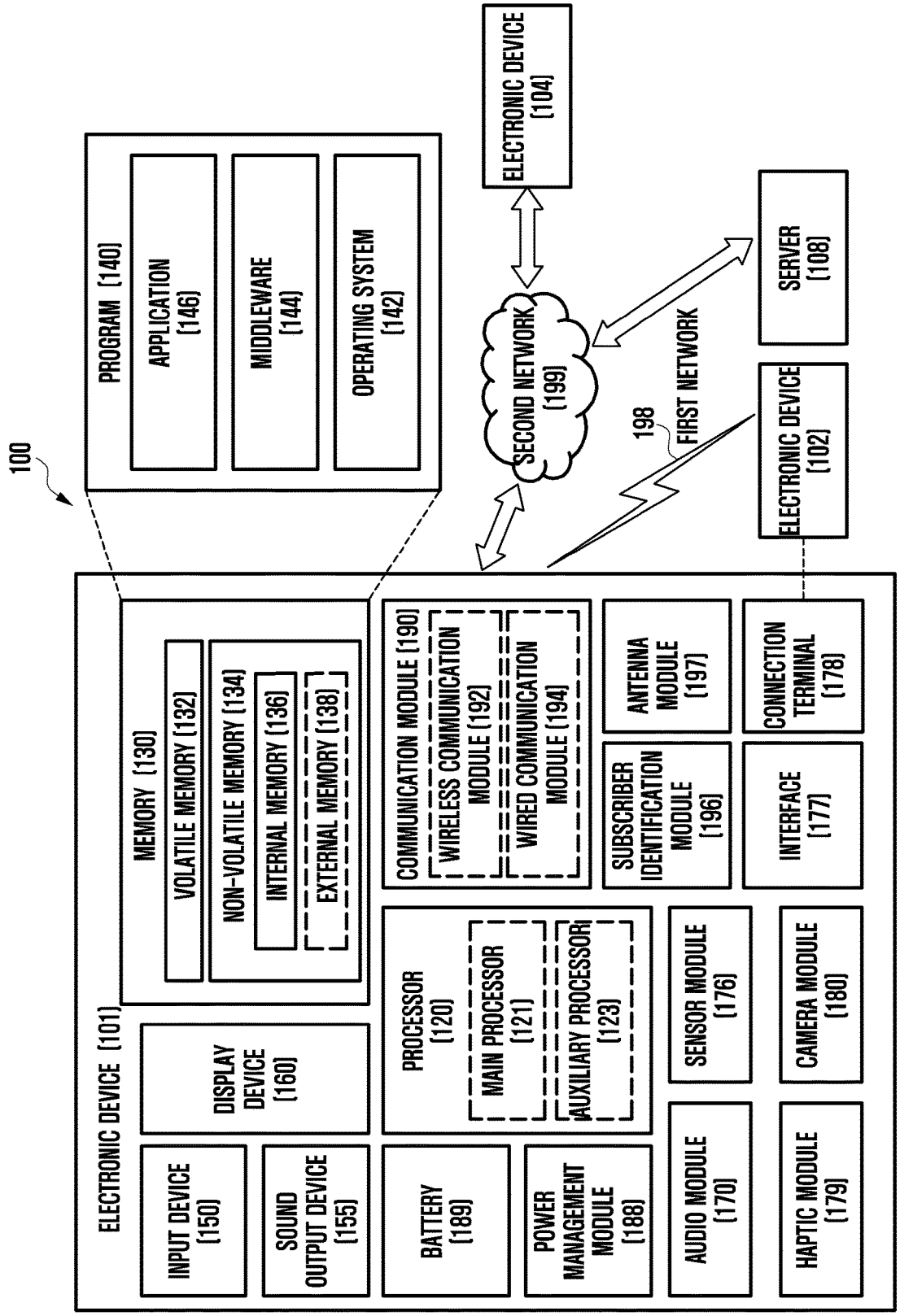
FIG. 1 is a block diagram illustrating an electronic device in a network environment according to an embodiment of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the displays, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
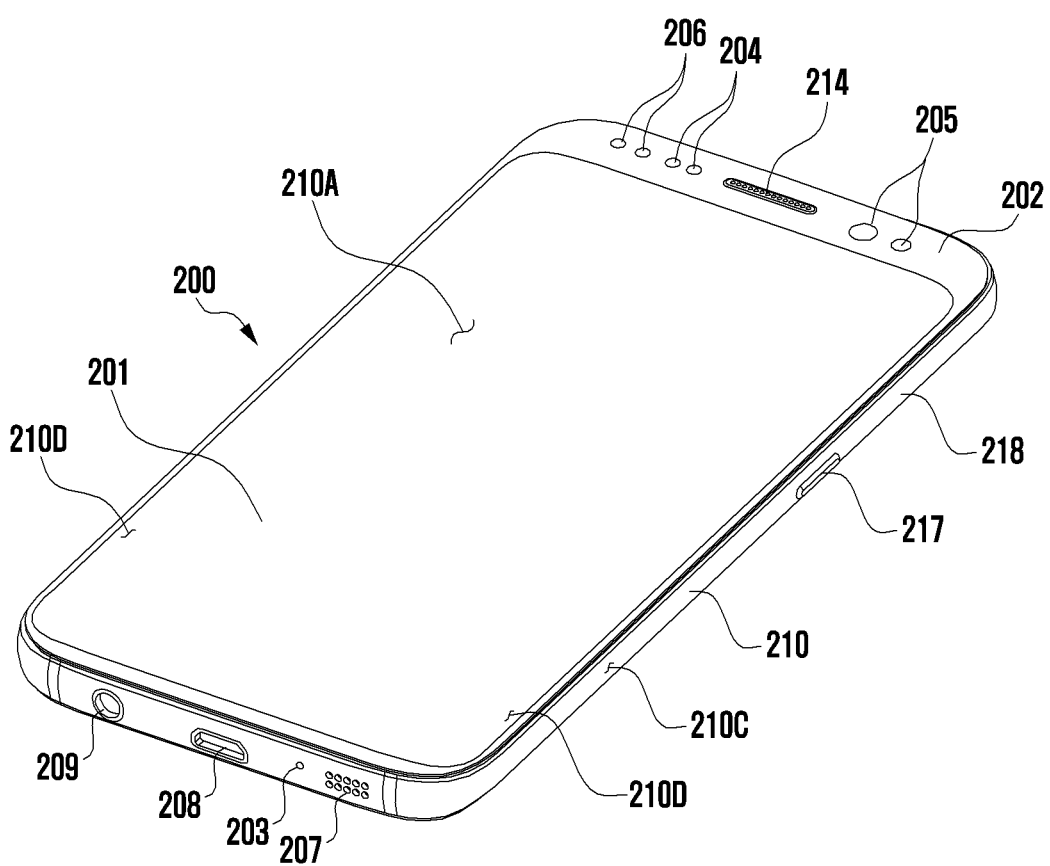
FIG. 2A is a perspective view illustrating a mobile electronic device according to an embodiment of the disclosure.
Figure 2B:
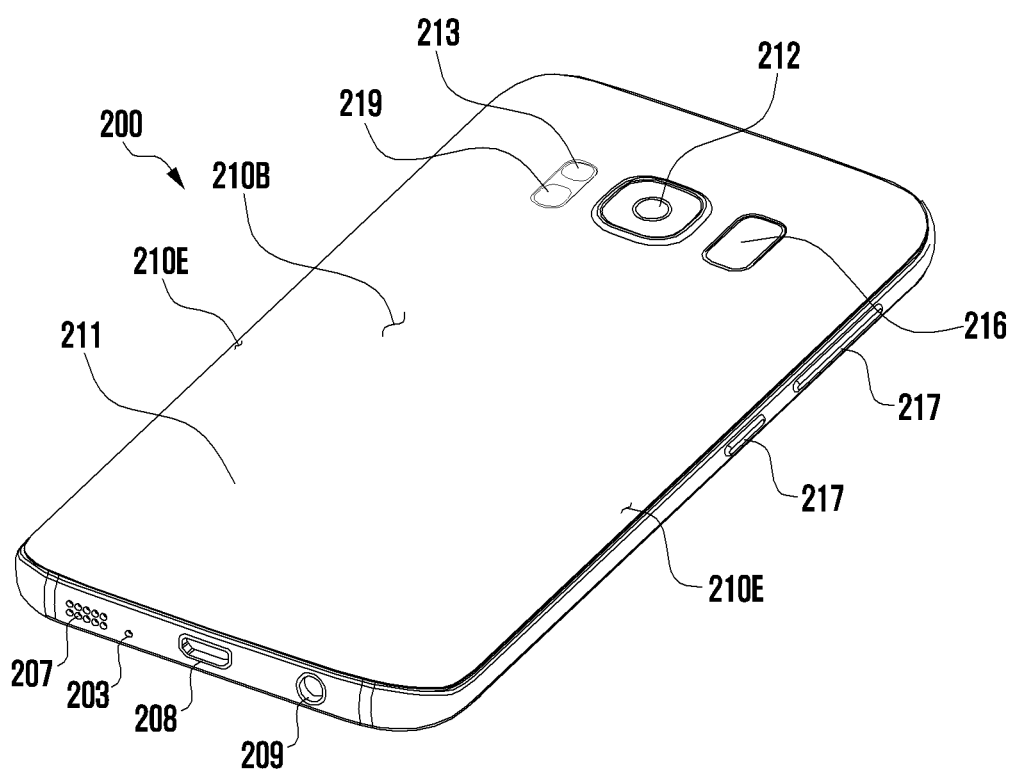
FIG. 2B is a rear perspective view illustrating a mobile electronic device according to an embodiment of the disclosure.

FIG. 2A is a perspective view illustrating a front surface of a mobile electronic device according to an embodiment of the disclosure. FIG. 2B is a perspective view illustrating a rear surface of the electronic device of FIG. 2A according to an embodiment of the disclosure.

Referring to FIGS. 2A and 2B, according to an embodiment, an electronic device 200 may include a housing 210 that includes a first surface (or front surface) 210A, a second surface (or rear surface) 210B, and a lateral surface 210C that surrounds a space between the first surface 210A and the second surface 210B. According to another embodiment, the housing 210 may refer to a structure that forms a part of the first surface 210A, the second surface 210B, and the lateral surface 210C. According to an embodiment, the first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

In the shown embodiment, the front plate 202 may include two first regions 210D disposed at long edges thereof, respectively, and bent and extended seamlessly from the first surface 210A toward the rear plate 211. In the shown embodiment, the rear plate 211 may include two second regions 210E disposed at long edges thereof, respectively, and bent and extended seamlessly from the second surface 210B toward the front plate 202 (refer to FIG. 2B). In various embodiments, the front plate 202 (or the rear plate 211) may include only one of the first regions 210D (or of the second regions 210E). In various embodiments, the first regions 210D or the second regions 210E may be omitted in part. In the embodiments, when viewed from a lateral side of the electronic device 200, the lateral bezel structure 218 may have a first thickness (or width) on a lateral side where one of the first regions 210D or one of the second regions 210E is not included, and may have a second thickness, being less than the first thickness, on another lateral side where one of the first regions 210D or one of the second regions 210E is included.

According to an embodiment, the electronic device 200 may include at least one of a display 201, audio modules 203, 207 and 214, sensor modules 204, 216 and 219, camera modules 205, 212 and 213, key input devices 217, a light emitting device 206, and connector holes 208 and 209. In various embodiments, the electronic device 200 may omit at least one (e.g., the key input devices 217 or the light emitting device 206) of the above components, or may further include other components.

The display 201 may be exposed through a substantial portion of the front plate 202, for example. In various embodiments, at least a part of the display 201 may be exposed through the front plate 202 that forms the first surface 210A and the first regions 210D. In various embodiments, outlines (i.e., edges and corners) of the display 201 may have substantially the same form as those of the front plate 202. In another embodiment (not shown), the spacing between the outline of the display 201 and the outline of the front plate 202 may be substantially unchanged in order to enlarge the exposed area of the display 201.

In another embodiment (not shown), a recess or opening may be formed in a portion of a display area of the display 201 to accommodate at least one of the audio modules (e.g., the audio module 214), the sensor module 204, the camera module 205, and the light emitting device 206. In another embodiment (not shown), at least one of the audio modules (e.g., the audio module 214), the sensor module 204, the camera module 205, the sensor module 216 (e.g., a fingerprint sensor), and the light emitting device 206 may be disposed on the back of the display area of the display 201. In another embodiment (not shown), the display 201 may be combined with, or adjacent to, a touch sensing circuit, a pressure sensor capable of measuring the touch strength (pressure), and/or a digitizer for detecting a stylus pen. In various embodiments, at least a part of the sensor modules 204 and 219 and/or at least a part of the key input devices 217 may be disposed in one of the first regions 210D and/or one of the second regions 210E.

The audio modules 203, 207 and 214 may correspond to a microphone hole (e.g., the audio module 203) and speaker holes (e.g., the audio modules 207 and 214). The microphone hole may contain a microphone disposed therein for acquiring external sounds and, in a case, contain a plurality of microphones to sense a sound direction. The speaker holes may be classified into an external speaker hole and a call receiver hole. In various embodiments, the microphone hole and the speaker holes may be implemented as a single hole, or a speaker (e.g., a piezo speaker) may be provided without the speaker holes.

The sensor modules 204, 216 and 219 may generate electrical signals or data corresponding to an internal operating state of the electronic device 200 or to an external environmental condition. The sensor modules 204, 216 and 219 may include a first sensor module (e.g., the sensor module 204) (e.g., a proximity sensor) and/or a second sensor module (e.g., a fingerprint sensor) disposed on the first surface 210A of the housing 210, and/or a third sensor module (e.g., the sensor module 219) (e.g., a heart rate monitor (HRM) sensor) and/or a fourth sensor module (e.g., the sensor module 216) (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device (e.g., the camera module 205) disposed on the first surface 210A of the electronic device 200, and a second camera device (e.g., the camera module 212) and/or a flash (e.g., the camera module 213) disposed on the second surface 210B. The camera module 205 or the camera module 212 may include one or more lenses, an image sensor, and/or an image signal processor. The flash may include, for example, a light emitting diode or a xenon lamp. In various embodiments, two or more lenses (infrared cameras, wide angle and telephoto lenses) and image sensors may be disposed on one side of the electronic device 200.

The key input devices 217 may be disposed on the lateral surface 210C of the housing 210. In another embodiment, the electronic device 200 may not include some or all of the key input devices 217 described above, and the key input devices 217 which are not included may be implemented in another form such as a soft key on the display 201. In various embodiments, the key input devices 217 may include the sensor module 216 disposed on the second surface 210B of the housing 210.

The light emitting device 206 may be disposed on the first surface 210A of the housing 210, for example. For example, the light emitting device 206 may provide status information of the electronic device 200 in an optical form. In various embodiments, the light emitting device 206 may provide a light source associated with the operation of the camera module 205. The light emitting device 206 may include, for example, a light emitting diode (LED), an infrared (IR) LED, or a xenon lamp.

The connector holes 208 and 209 may include a first connector hole (e.g., the connector hole 208) adapted for a connector (e.g., a universal serial bus (USB) connector) for transmitting and receiving power and/or data to and from an external electronic device, and/or a second connector hole (e.g., the connector hole 209) adapted for a connector (e.g., an earphone jack) for transmitting and receiving an audio signal to and from an external electronic device.

Figure 3:
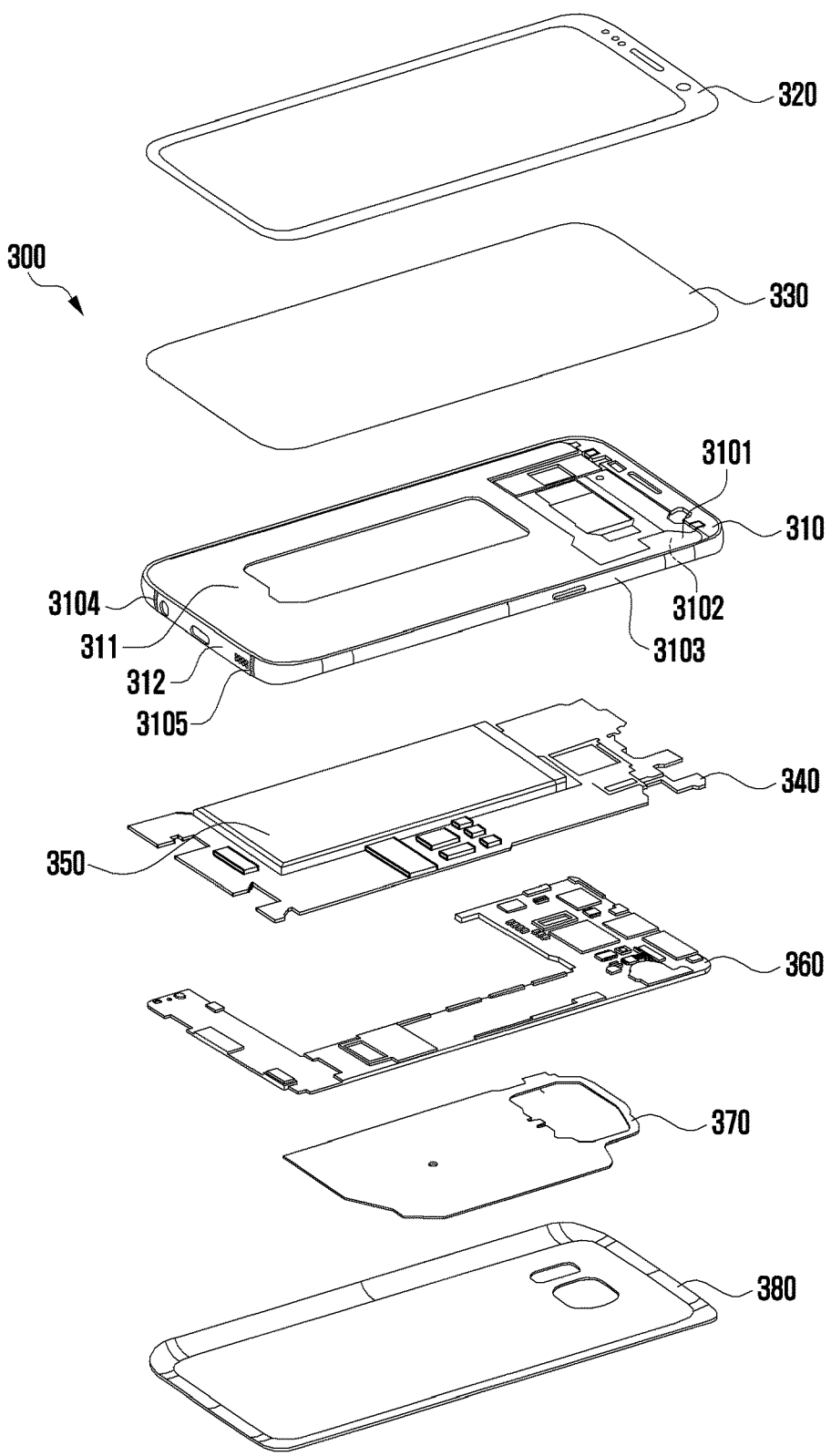
FIG. 3 is an exploded perspective view illustrating a mobile electronic device according to an embodiment of the disclosure.

FIG. 3 is an exploded perspective view illustrating the electronic device of FIG. 2A according to an embodiment of the disclosure.

Referring to FIG. 3, an electronic device 300 (e.g., the electronic device 200 of FIG. 2A) may include a lateral bezel structure 310, a first support member 311 (e.g., a bracket), a front plate 320, a display 330 (e.g., the display 201), a printed circuit board (PCB) 340, a battery 350, a second support member 360 (e.g., a rear case), an antenna 370, and a rear plate 380. In various embodiments, the electronic device 300 may omit at least one (e.g., the first support member 311 or the second support member 360) of the above components or may further include another component. Some components of the electronic device 300 may be the same as or similar to those of the electronic device 200 shown in FIG. 2A or FIG. 2B, thus, descriptions thereof are omitted below.

The first support member 311 is disposed inside the electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the electronic device 300, and may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

The lateral member 310 may have a first surface 3101 facing the first plate 320, a second surface 3102 facing the second plate 380, and a lateral surface 3103 surrounding a space (e.g., a space 3001 in FIG. 4A) between the first surface 3101 and the second surface 3102. According to an embodiment, the electronic device 300 may include a conductive portion 312 segmented and electrically insulated through a pair of non-conductive portions 3104 and 3105 spaced apart from each other at a certain interval in at least a part of the lateral member 310. According to an embodiment, the conductive portion 312 may be utilized as an antenna by being electrically connected to a wireless communication circuit disposed on the printed circuit board 340. According to an embodiment, the antenna may include a conductive extended portion (e.g., a conductive extended portion 3123 in FIG. 4A) extended from the conductive portion 312 into the inner space of the electronic device 300. Through the conductive portion 312 and the conductive extended portion (e.g., the conductive extended portion 3123 in FIG. 4A), the antenna is capable of operating in a desired frequency band without degradation in radiation performance.

Hereinafter, the configuration of an antenna according to various embodiments of the disclosure will be described in detail.

Figure 4A:
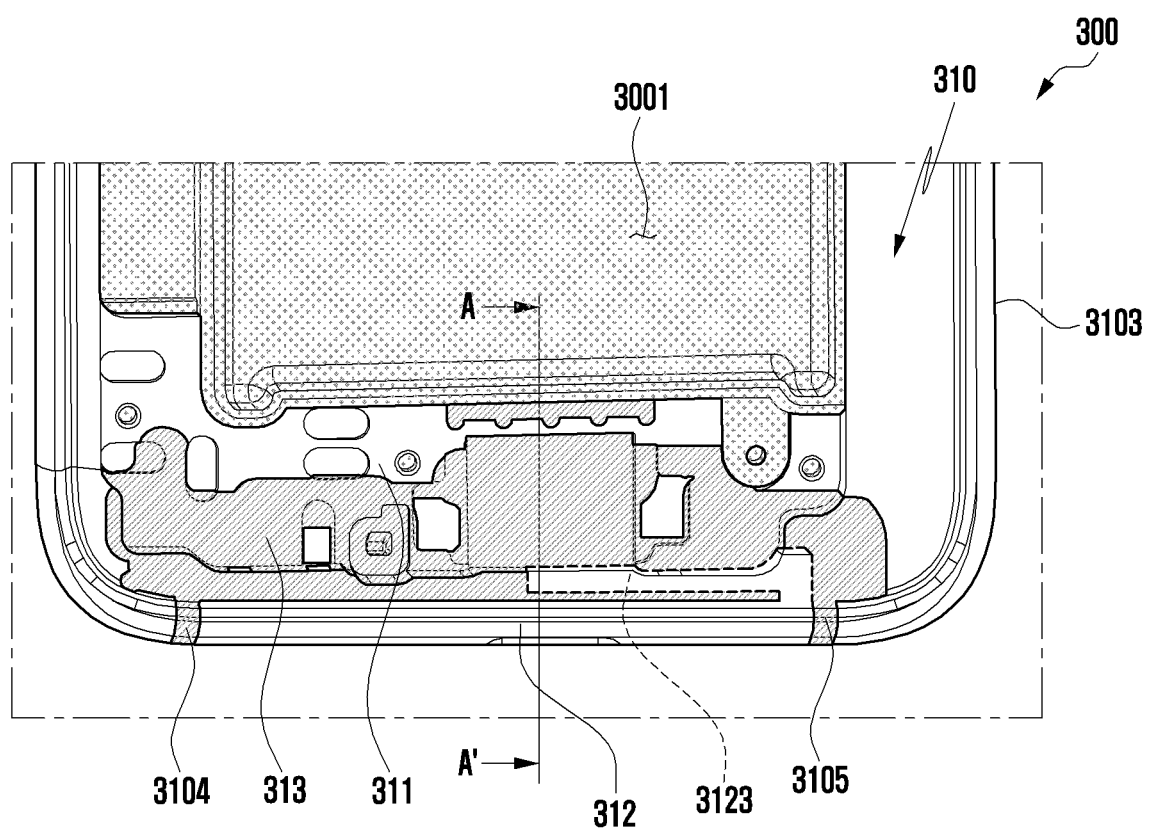
FIG. 4A is a plan view partially illustrating a lateral member including an antenna according to an embodiment of the disclosure.
Figure 4B:
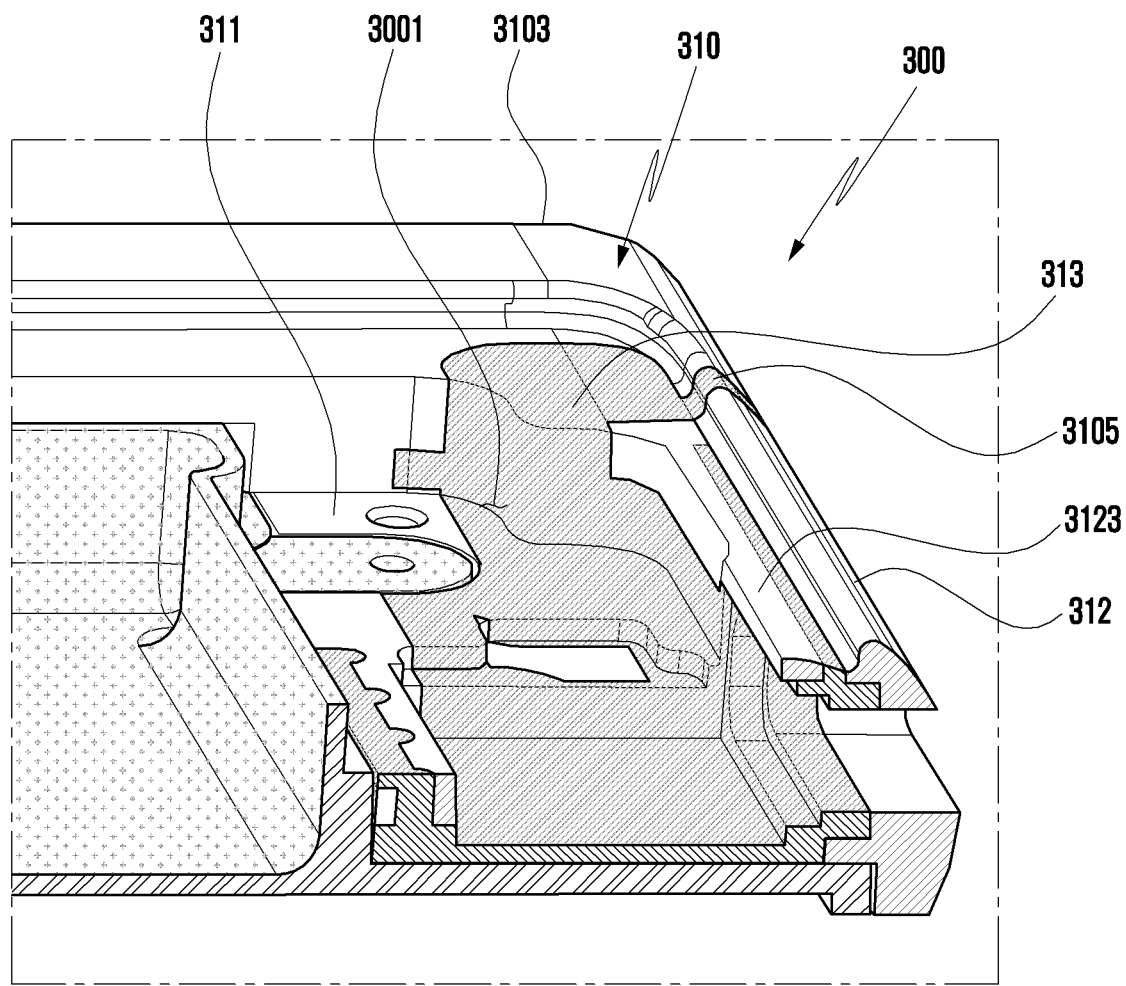
FIG. 4B is a partial cross-sectional view of a lateral member taken along the line A-A' of FIG. 4A according to an embodiment of the disclosure.

FIG. 4A is a plan view partially illustrating a lateral member 310 including an antenna according to an embodiment of the disclosure. FIG. 4B is a partial cross-sectional view of a lateral member 310 taken along the line A-A' of FIG. 4A according to an embodiment of the disclosure.

Referring to FIGS. 4A and 4B, the electronic device 300 may include the lateral member 310 and a first support member 311 extended from the lateral member 310 toward an inner space 3001. According to an embodiment, at least a part of the first support member 311 may be formed of a conductive member (e.g., a metal member) extended from the lateral member 310 made of a conductive material, and another part may be formed as a polymer portion 313 (e.g., synthetic resin). According to an embodiment, the conductive member and the polymer portion 313 may be formed into one body through insert injection. In another embodiment, the at least partially formed conductive part of the first support member 311 may be formed as a separate structure (island type) electrically isolated from the lateral surface 3103 through the polymer portion 313.

According to various embodiments, the lateral member 310 may include a conductive portion 312 disposed in at least a partial region of the lateral surface 3103. According to an embodiment, the conductive portion 312 may be segmented as a unit conductive portion 312 through a pair of non-conductive portions 3104 and 3105 spaced apart from each other at a certain interval on the lateral surface 3103. According to an embodiment, the conductive portion 312 may be used as an antenna by being electrically connected to a wireless communication circuit (e.g., a power feeder 342 in FIG. 5) disposed on a printed circuit board (e.g., a printed circuit board 340 in FIG. 5) to be described later. According to an embodiment, the electrical length of the conductive portion 312 used as an antenna may be determined through a spaced interval between the first non-conductive portion 3104 and the second non-conductive portion 3105. According to an embodiment, the first non-conductive portion 3104 and the second non-conductive portion 3105 may be extended from the polymer portion 313, and may be formed together by an insert-injection process. In another embodiment, the first non-conductive portion 3104 and the second non-conductive portion 3105 may be formed of a different insulating material separately from the polymer portion 313. According to an embodiment, the first non-conductive portion 3104 and the second non-conductive portion 3105 may be disposed to be exposed on the outer surface of the electronic device 300 together with the conductive portion 312. In another embodiment, the first non-conductive portion 3104 and the second non-conductive portion 3105 may be disposed invisible to the naked eye through a paint of an opaque material applied through substantially the entire lateral surface 3103.

According to various embodiments, the conductive portion 312 may include a conductive extended portion 3123 extended from one end of the conductive portion 312 into the space 3001 to have a certain shape and electrical length. According to an embodiment, the conductive portion 312 may be utilized as an antenna that operates in a desired frequency band through the conductive extended portion 3123. For example, the conductive portion 312 may be operated in an operating frequency band shifted to a low frequency band (e.g., a low band) through the conductive extended portion 3123 than when only the conductive portion is used. In this case, because the conductive extended portion 3123 is extended directly from the conductive portion 312, degradation in the radiation performance of the antenna can be prevented. According to an embodiment, the conductive extended portion 3123 may receive strong support by being insert-injected together with the polymer portion 313 in the inner space 3001 of the electronic device 300. According to an embodiment, the conductive extended portion 3123 may be disposed to be at least partially exposed from the polymer portion 313. In another embodiment, the conductive extended portion 3123 may be disposed to be embedded within the polymer portion 313 without being exposed from the polymer portion 313. In another embodiment, the conductive extended portion 3123 may be disposed to be extended to a location spaced apart from the polymer portion 313 in the inner space 3001 of the electronic device 300.

Figure 5:
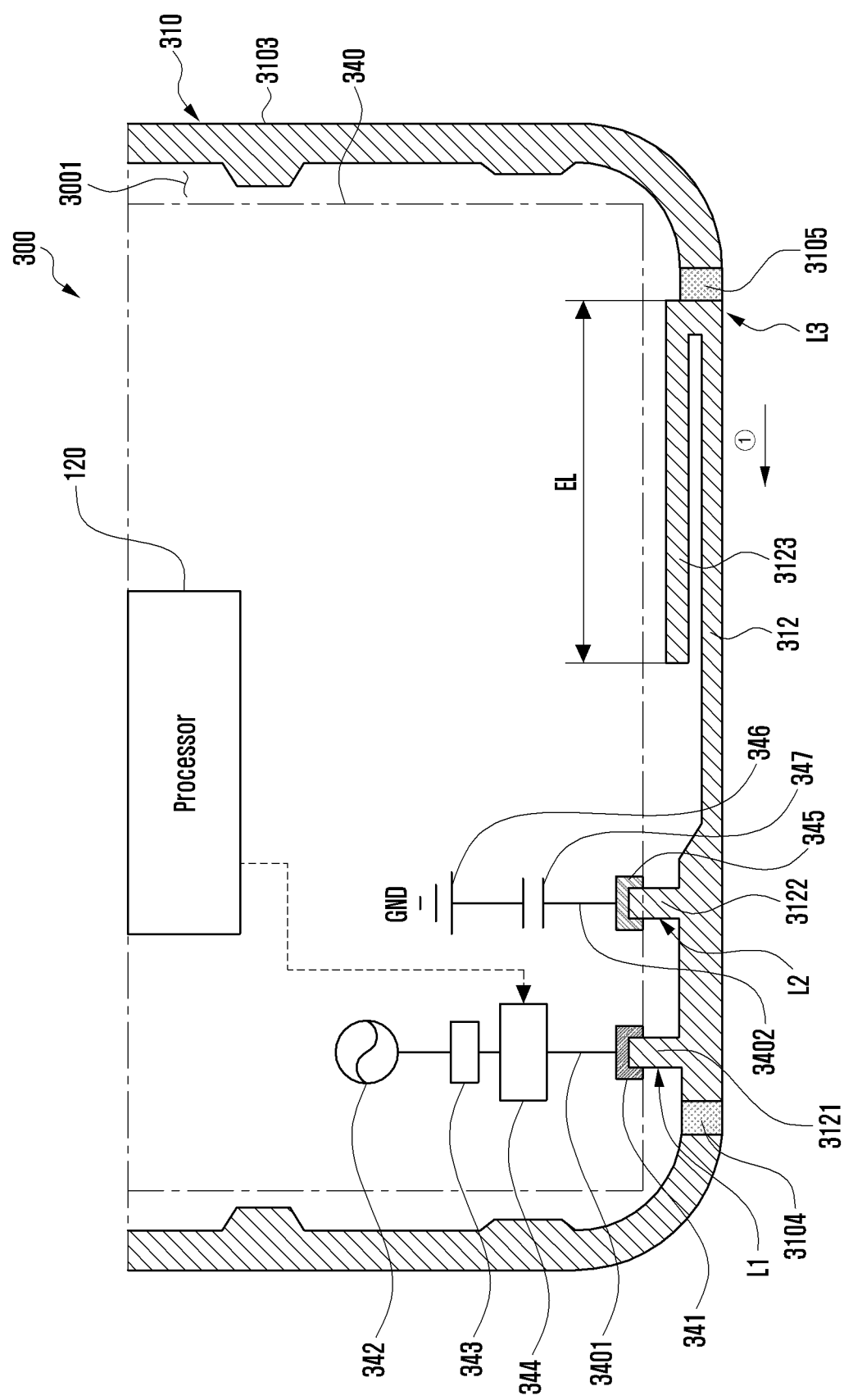
FIG. 5 is a diagram illustrating the arrangement of an antenna in an electronic device according to an embodiment of the disclosure.

FIG. 5 is a diagram illustrating the arrangement of an antenna in an electronic device according to an embodiment of the disclosure.

Referring to FIG. 5, the electronic device 300 may include the processor 120 and the lateral member 310 having the lateral surface 3103. According to an embodiment, the lateral member 310 may have a first connection piece 3121 formed at a first location L1 of the conductive portion 312, and a second connection piece 3122 formed at a second location L2. According to an embodiment, the first location L1 may be disposed closer to the first non-conductive portion 3104 than the second location L2. In another embodiment, the first location L1 may be disposed farther from the first non-conductive portion 3104 than the second location L2. According to an embodiment, the first connection piece 3121 and the second connection piece 3122 may be integrally formed with the conductive portion 312. According to an embodiment, the first connection piece 3121 and the second connection piece 3122 may be disposed to be overlapped with at least a part of the printed circuit board 340 disposed in at least a part of the inner space 3001 of the electronic device 300.

According to various embodiments, the electronic device 300 may include the printed circuit board 340 disposed in the inner space 3001 of the electronic device 300. According to an embodiment, the printed circuit board 340 may include a first connection part 341 (e.g., a conductive pad) electrically connected to the first connection piece 3121. According to an embodiment, the printed circuit board 340 may include a first electrical path 3401 (e.g., a wiring line) connected from the first connection part 341 to the power feeder 342 (e.g., a wireless communication circuit). According to an embodiment, the power feeder 342 may transmit a signal of a desired frequency band at the first location L1 of the conductive portion 312 electrically connected through the first electrical path 3401. According to an embodiment, a matching circuit 344 may be disposed on the first electrical path 3401. According to an embodiment, on the first electrical path 3401, an electric shock prevention circuit 343 may be further disposed for preventing electric shock and for electro-static discharge (ESD) because the printed circuit board 340 has a configuration of directly electrical contact with the lateral member 310 forming the exterior of the electronic device 300. In another embodiment, the matching circuit 344 may be replaced with a variable element that shifts the operating frequency band through selective switching of a plurality of passive elements.

According to various embodiments, the printed circuit board 340 may include a second connection part 345 (e.g., a conductive pad) electrically connected to the second connection piece 3122. According to an embodiment, the printed circuit board 340 may include a second electrical path 3402 (e.g., a wiring line) connected from the second connection part 345 to the ground (GND) 346 of the printed circuit board 340. According to an embodiment, the printed circuit board 340 may include at least one electric shock protection capacitor 347 disposed on the second electrical path 3402.

According to various embodiments, the conductive portion 312 may include the conductive extended portion 3123 extended from a third location L3 of the end contacting the second non-conductive portion 3105 toward the inner space 3001 of the electronic device 300. According to an embodiment, the conductive extended portion 3123 may be extended from the third location L3 of the conductive portion 312 in a direction (direction ①) toward the first non-conductive portion 3104 in parallel or non-parallel with the conductive portion 312. Accordingly, the conductive portion 312 electrically connected to the power feeder 342 may have an electrical length including the conductive extended portion 3123 extended at a certain length EL from the third location L3, and may be determined to operate in a desired operating frequency band. For example, the corresponding frequency band may have a range of about 850 megahertz (MHz) to 3000 MHz.

According to various embodiments, when the first plate (e.g., the front plate 320 in FIG. 3) is viewed from above, at least a part of the conductive extended portion 3123 may be disposed so as not to be overlapped with the printed circuit board 340. In another embodiment, when the first plate (e.g., the front plate 320 in FIG. 3) is viewed from above, at least a part of the conductive extended portion 3123 may be disposed so as to be overlapped with the printed circuit board 340. In this case, in order to prevent signal distortion and/or radiation performance degradation due to surrounding conductors, a region of the printed circuit board 340 overlapped with the conductive extended portion 3123 may be formed as a non-conductive region.

According to various embodiments, the conductive portion 312 may be electrically connected to the wireless communication circuit 342 at the first location L1 and electrically connected to the ground 346 of the printed circuit board 340 at the second location L2 different from the first location L1 (PIFA type). In another embodiment, the conductive portion 312 may be electrically connected to both the wireless communication circuit 342 and the ground 346 of the printed circuit board 340 simultaneously at the first location L1 (semi-PIFA type). In still another embodiment, the conductive portion 312 may be electrically connected to the wireless communication circuit 342 at the first location L1, electrically connected to the ground 346 of the printed circuit board 340 at a plurality of points different from the first location L1, and configured to be electrically connected to at least one ground point through a switch so that the operating frequency band may be determined depending on the electrical length adjustment of the conductive portion 312 (aperture switch type).

Figure 6:
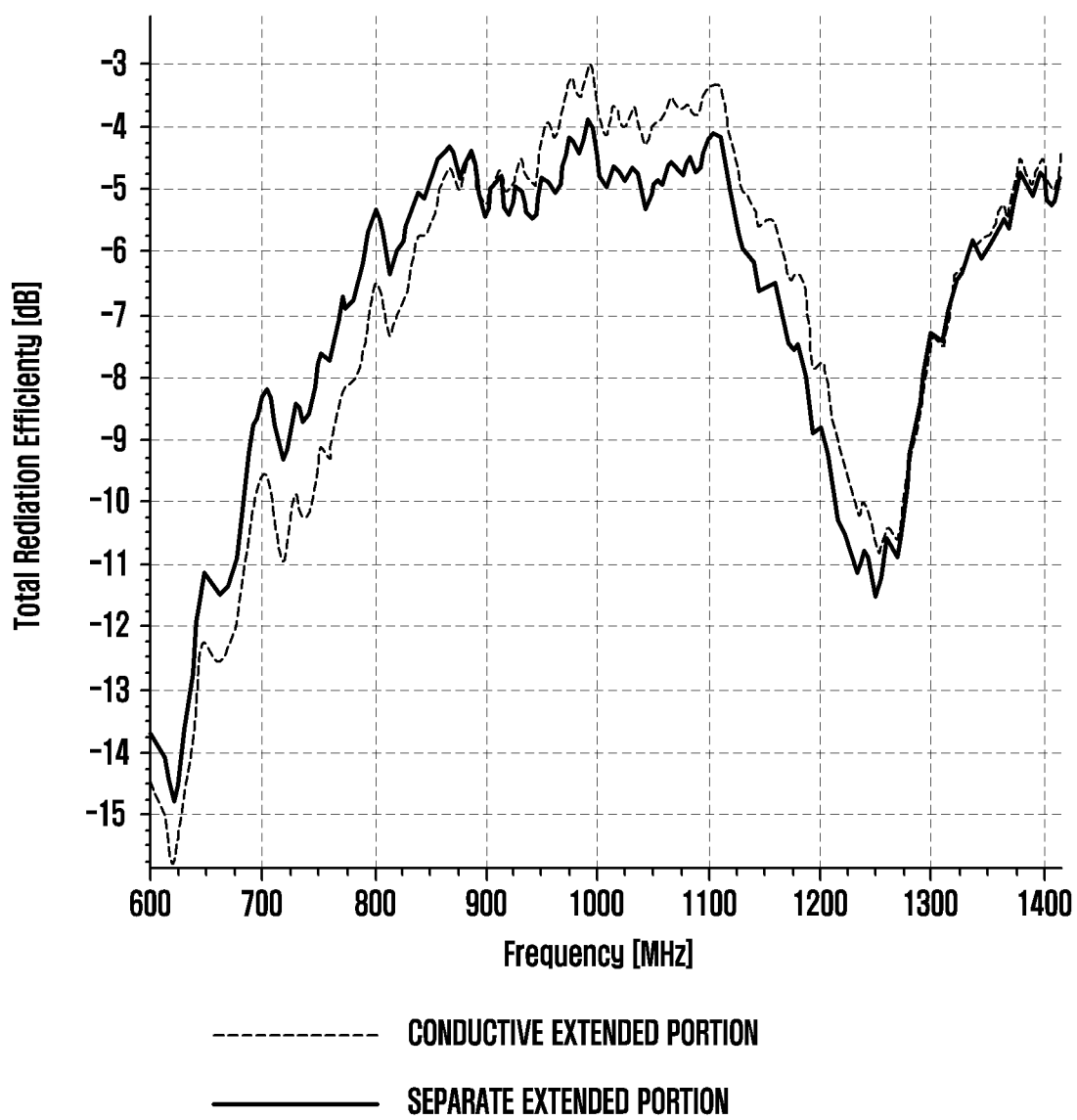
FIG. 6 is a graph comparing the radiation efficiency of antennas according to an embodiment of the disclosure.

FIG. 6 is a graph comparing the radiation efficiency of antennas according to an embodiment of the disclosure.

Referring to FIG. 6, it can be seen that, compared to a conventional conductive portion spaced apart from and electrically connected to a conductive extended portion through a separate electrical connection member, a conductive portion (e.g., the conductive portion 312 in FIG. 5) including a conductive extended portion (e.g., the conductive extended portion 3123 in FIG. 5) integrally extended from the third location L3 of the conductive portion 312 exhibits a relatively high efficiency in the range of about 850 MHz to 1200 MHz which is an operating frequency band.

FIGS. 7A to 7E are diagrams illustrating the configuration of a conductive extended portion according to various embodiments of the disclosure.

According to various embodiments, the conductive extended portion may be formed in various shapes in the inner space of the electronic device.

In describing the drawings, because the feeding and grounding configuration of the conductive portion 312 is substantially the same as shown in FIG. 5, detailed description thereof will be omitted, and only the conductive extended portion will be described.

Figure 7A:
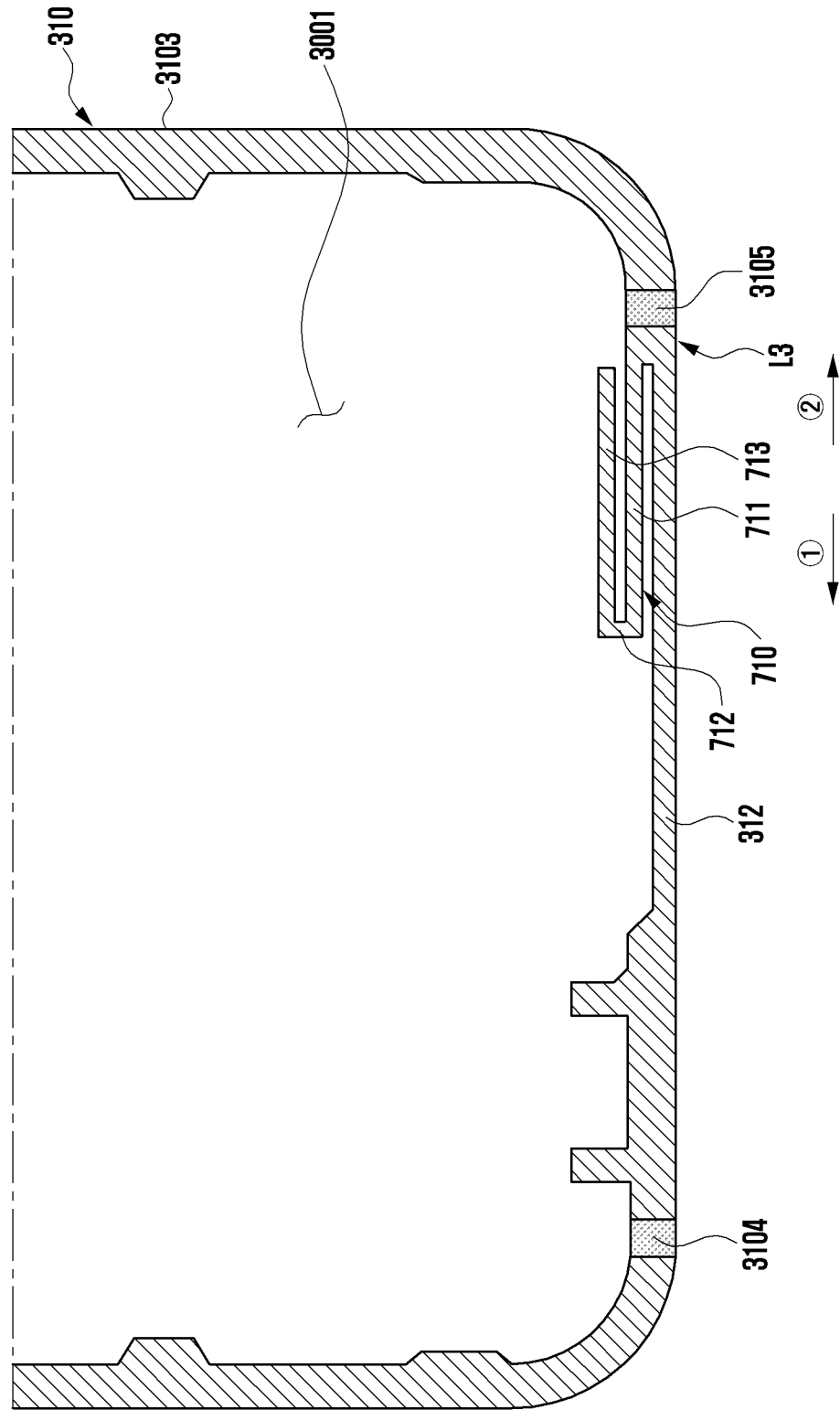

Referring to FIG. 7A, the conductive portion 312 may include a conductive extended portion 710 extended from the third location L3 of the end contacting the second non-conductive portion 3105 toward the inner space 3001 of the electronic device 300. According to an embodiment, the conductive extended portion 710 may include a first portion 711 extended in a direction (direction ①) toward the conductive portion with a certain interval from the conductive portion 312, a second portion 712 bent from the first portion 711 in a direction toward the space, and a third portion 713 extended from the second portion 712 in a direction (direction ②) toward the second non-conductive portion. According to an embodiment, the conductive extended portion 710 may have an electrical length increased by the extended portions bent a plurality of times at certain intervals in different directions. This may mean that the conductive portion 312 used as an antenna may be determined to be shiftable to a lower frequency band.

Referring to FIG. 7B, the conductive portion 312 may include a conductive extended portion 720 extended from the third location L3 of the end contacting the second non-conductive portion 3105 toward the inner space 3001 of the electronic device 300. According to an embodiment, the conductive extended portion 720 may include a first portion 721 extended from the conductive portion 312 in a direction toward the inner space 3001, and a second portion 722 extended from the first portion 721 in a direction (direction ②) toward the second non-conductive portion.

Figure 7C:
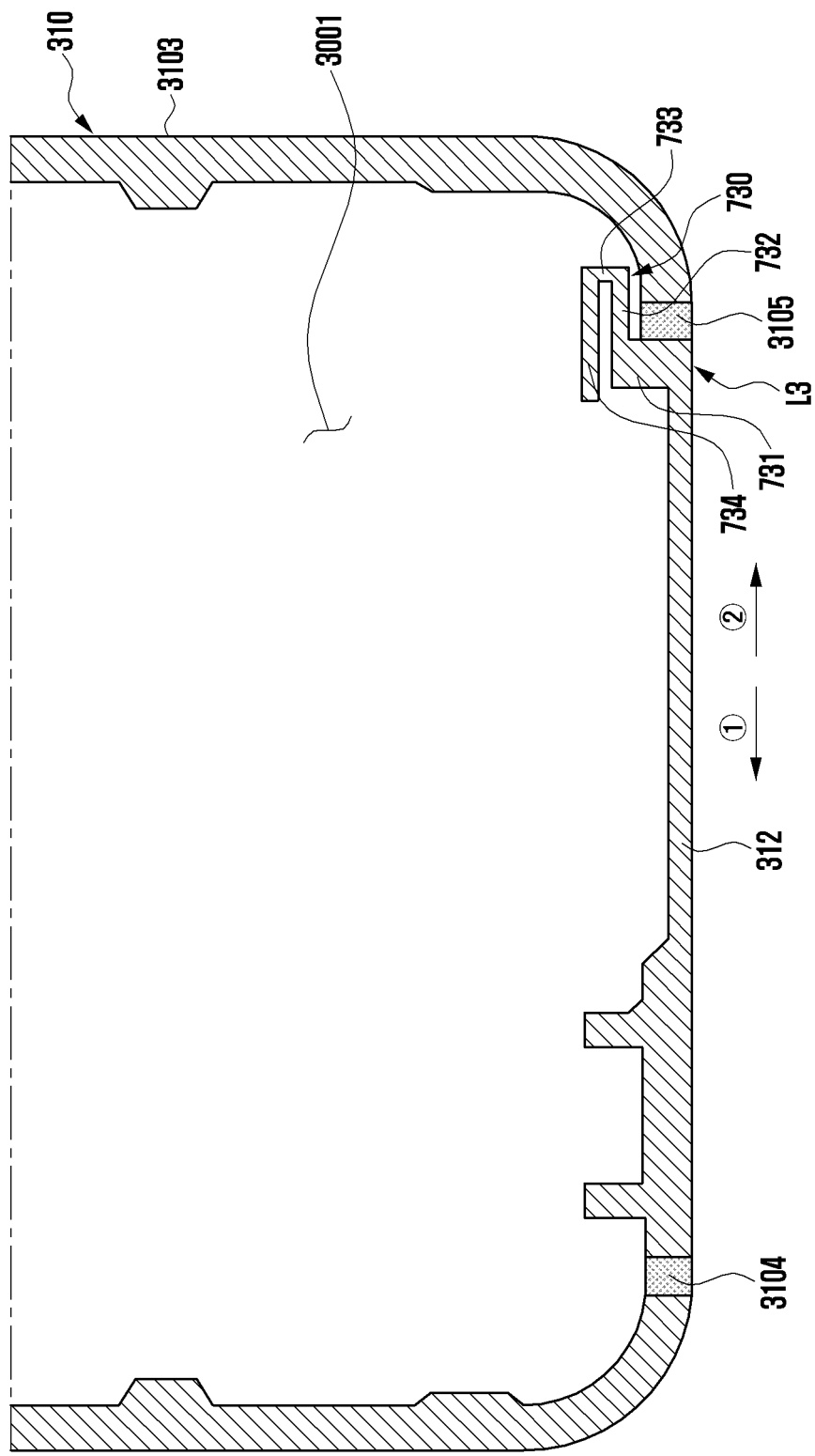

Referring to FIG. 7C, the conductive portion 312 may include a conductive extended portion 730 extended from the third location L3 of the end contacting the second non-conductive portion 3105 toward the inner space 3001 of the electronic device 300. According to an embodiment, the conductive extended portion 730 may include a first portion 731 extended from the conductive portion 312 in a direction toward the inner space 3001, a second portion 732 extended from the first portion 731 in a direction (direction ②) toward the second non-conductive portion, a third portion 733 extended from the second portion in the direction toward the inner space 3001, and a fourth portion 734 extended from the third portion 733 in a direction (direction ①) toward the conductive portion 312. The fourth portion 734 may be formed to have a length that passes or does not pass through the first portion 731.

Figure 7D:
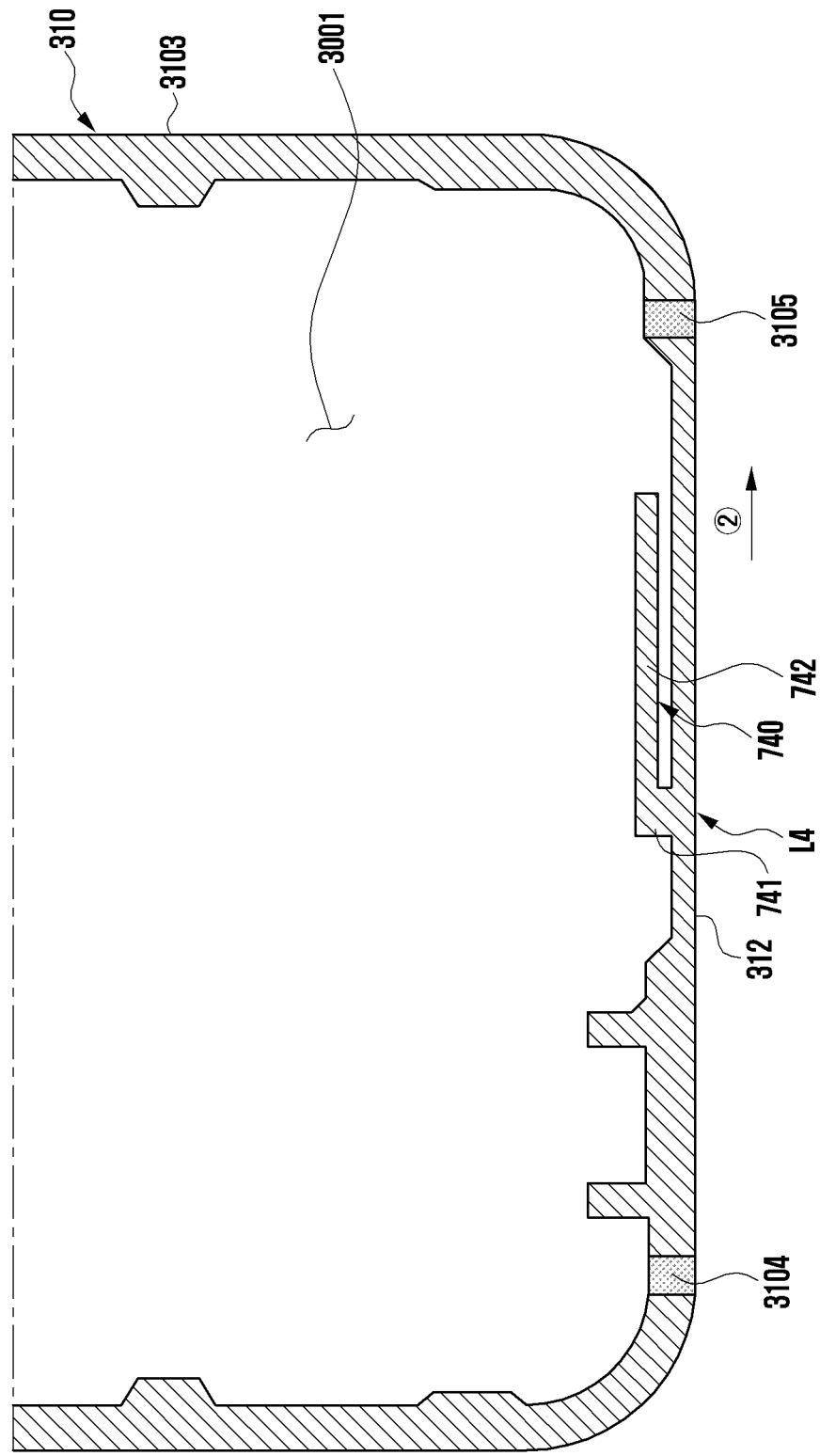

Referring to FIG. 7D, the conductive portion 312 may include a conductive extended portion 740 extended from a fourth location L4, which is at least a certain region, toward the inner space 3001 of the electronic device 300. According to an embodiment, the conductive extended portion 740 may include a first portion 741 extended from the conductive portion 312 in a direction toward the inner space 3001, and a second portion 742 extended from the first portion 741 in a direction (direction ②) toward the second non-conductive portion. According to an embodiment, the conductive portion 312 including the conductive extended portion 740 may operate as a dual-band antenna because the conductive extended portion 740 is extended from a certain region, not from the end of the conductive portion 312. In this case, the conductive portion 312 may operate in a first frequency band using a part of the conductive portion 312 and the conductive extended portion 740 as an electrical length, and simultaneously operate in a second frequency band, which is lower than the first frequency band, using the entire length of the conductive portion 312 as an electrical length.

Figure 7E:
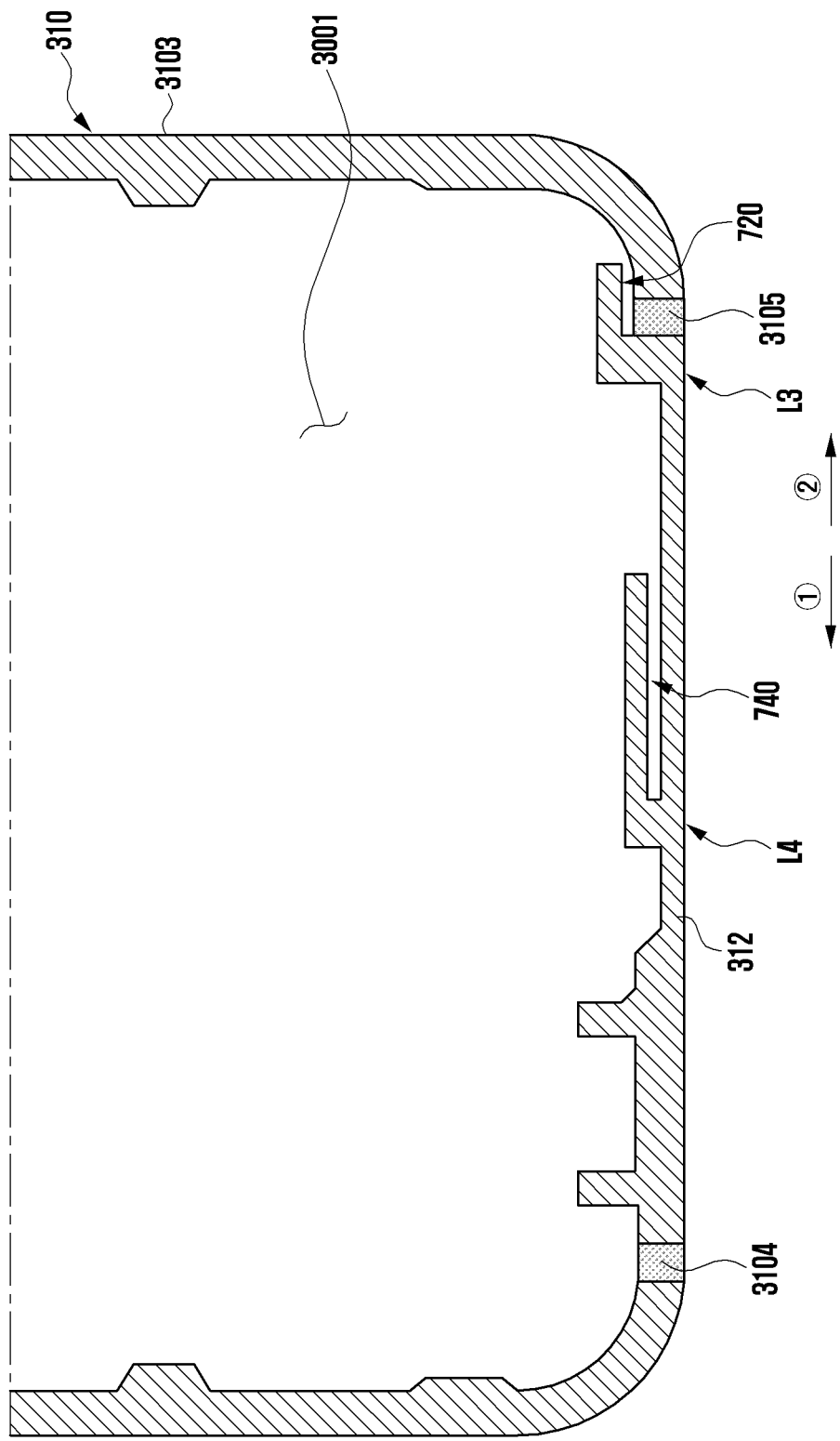

Referring to FIG. 7E, the conductive portion 312 may include the conductive extended portions 720 and 740 extended from at least certain regions (e.g., the third location L3 and the fourth location L4) toward the inner space 3001 of the electronic device 300. According to an embodiment, in order to cope with the slimming of the electronic device 300 and secure an efficient mounting space for the antenna, the conductive portion 312 may include both the conductive extended portion 720 shown in FIG. 7B and the conductive extended portion 740 shown in FIG. 7D. In another embodiment, the conductive portion 312 may include, instead of the conductive extended portion 720 in FIG. 7B, the conductive extended portion 3123 in FIG. 5, the conductive extended portion 710 in FIG. 7A, or the conductive extended portion 730 in FIG. 7C.

Figure 8:
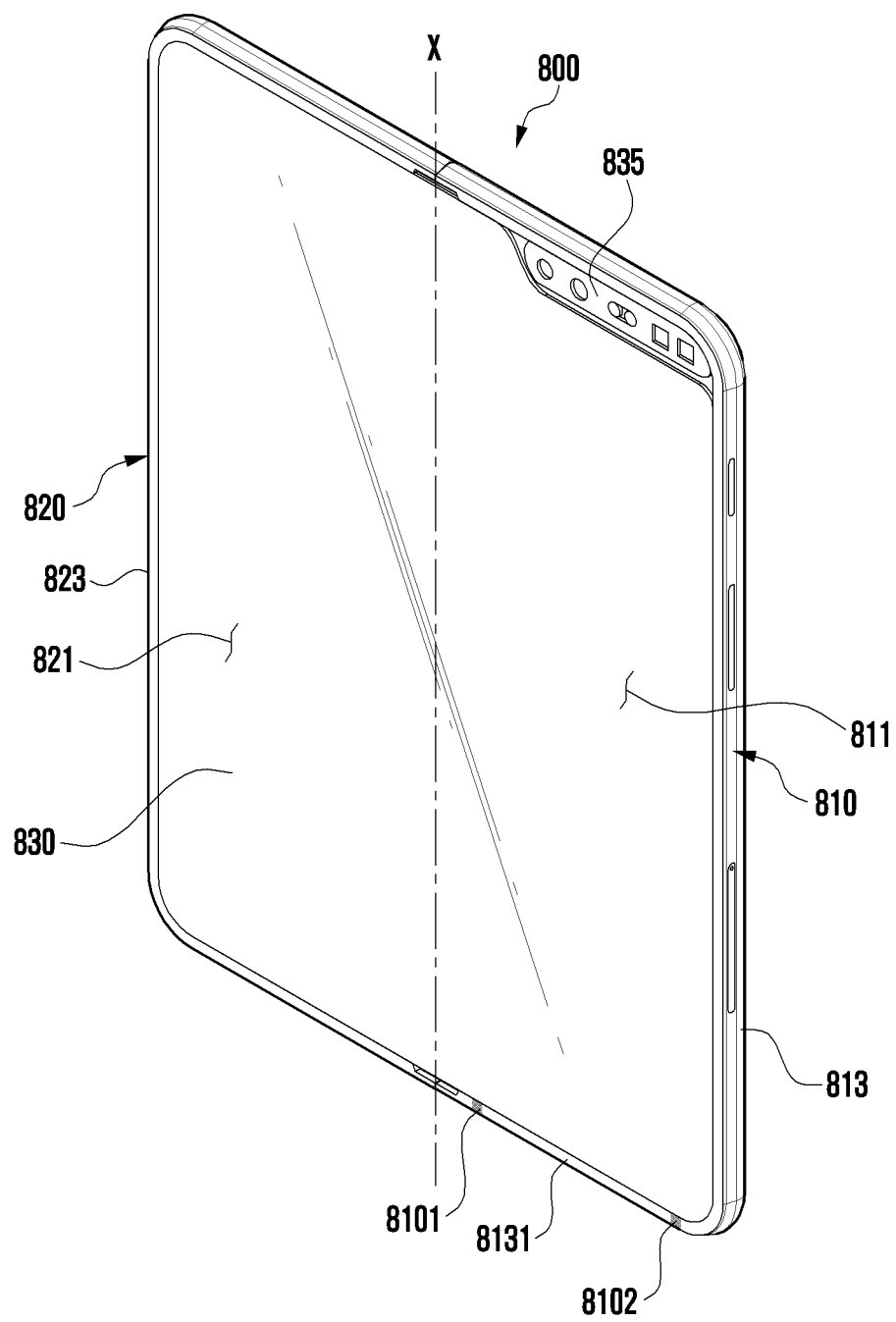
FIG. 8 is a perspective view illustrating a foldable electronic device according to an embodiment of the disclosure.
Figure 9A:
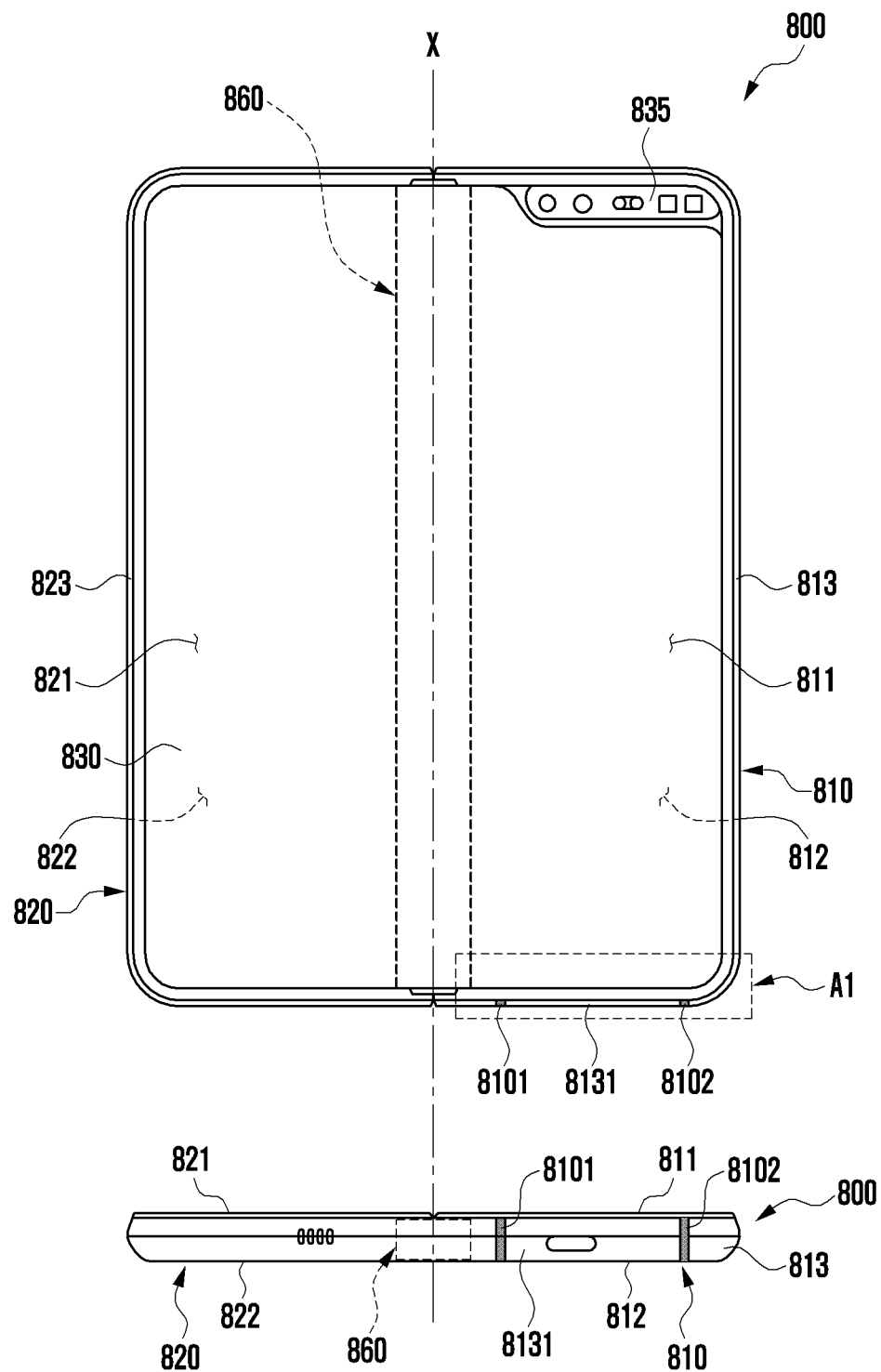
FIGS. 9A and 9B are views illustrating an unfolded state and a folded state of the foldable electronic device of FIG. 8 including an antenna according to various embodiments of the disclosure.
Figure 9B:
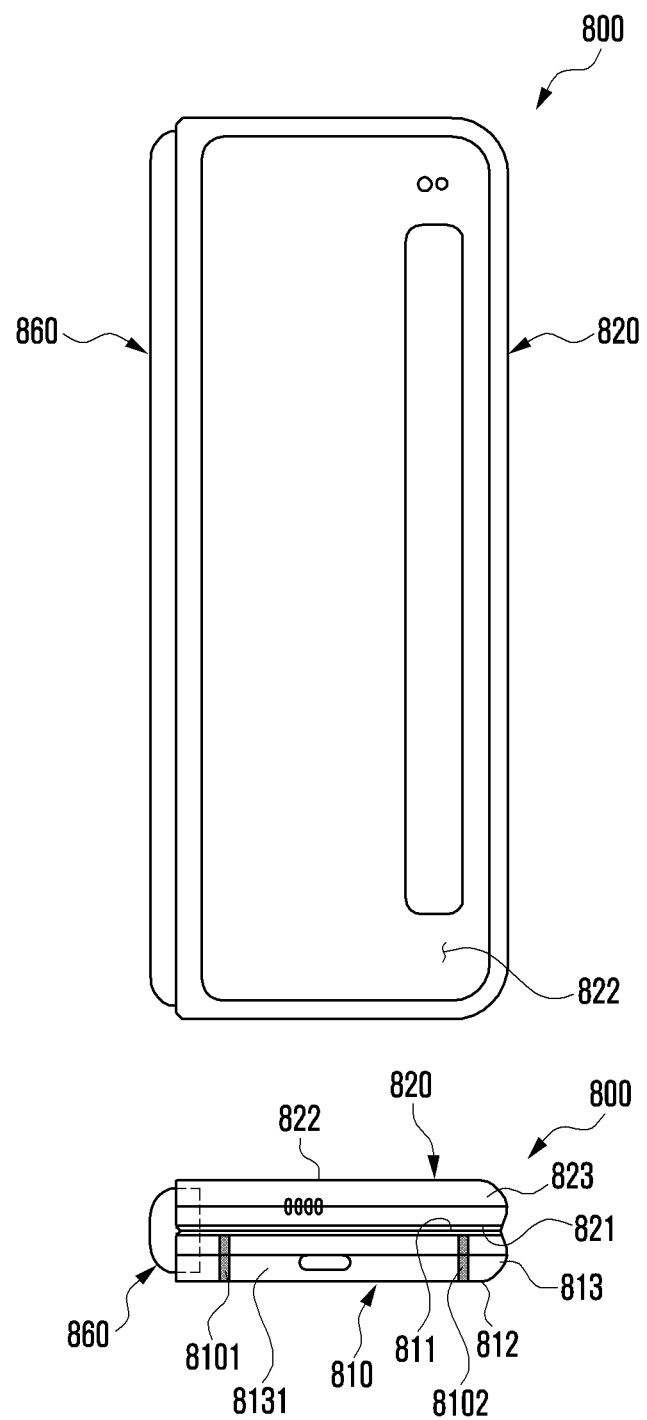

FIG. 8 is a perspective view illustrating a foldable electronic device according to an embodiment of the disclosure. FIGS. 9A and 9B are views illustrating an unfolded state and a folded state of the foldable electronic device of FIG. 8 including an antenna according to various embodiments of the disclosure.

The electronic device 800 shown in FIG. 8 may be similar, at least in part, to the electronic device 101 shown in FIG. 1, or may include other embodiments of the electronic device.

Referring to FIGS. 8 to 9B, the electronic device 800 may include foldable housing structures 810 and 820 (e.g., foldable housings) that are rotatably disposed based on the folding axis X. According to an embodiment, the foldable housing structures may include a first housing structure 810 (e.g., a first housing) and a second housing structure 820 (e.g., a second housing). According to an embodiment, the first housing structure 810 and the second housing structure 820 may be rotatably connected by a hinge structure 860. For example, the first housing structure 810 and the second housing structure 820 may be folded to face each other based on the folding axis X by the hinge structure 860 or may be opened with respect to each other to have the same plane.

According to various embodiments, the first housing structure 810 may have a first surface 811 facing in a first direction, a second surface 812 facing in a second direction opposite to the first direction, and a first lateral member 813 (e.g., a first lateral frame or a first lateral bezel) surrounding at least a part of a space between the first surface 811 and the second surface 812. According to an embodiment, at least a part of the first lateral member 813 may be formed of a conductive member (e.g., a metal member). According to an embodiment, at least a part of the first lateral member 813 formed of the conductive member may be applied as an antenna A1. According to an embodiment, the first lateral member 813 may be operated as the antenna A1 by being electrically divided to form a conductive portion 8131 through a first non-conductive portion 8101 and a second non-conductive portion 8102 spaced apart from each other in at least some regions.

According to various embodiments, the second housing structure 820 may have a third surface 821 facing in a third direction, a fourth surface 822 facing in a fourth direction opposite to the third direction, and a second lateral member 823 (e.g., a second lateral frame or a second lateral bezel) surrounding at least a part of a space between the third surface 821 and the fourth surface 822.

According to various embodiments, in a state where the first housing structure 810 and the second housing structure 820 are opened 180 degrees, the first surface 811 and the third surface 821 face the same direction to form a planar structure. According to an embodiment, the electronic device 800 may include a display 830 (e.g., a touch-type flexible display) disposed to cross the first surface 811 of the first housing structure 810 and the third surface 821 of the second housing structure 820. For example, when the first surface 811 of the first housing structure 810 and the third surface 821 of the second housing structure 820 are folded to face each other, the display 830 may also be folded to face each other based on the folding axis X. According to an embodiment, on at least a part of the first surface 811 of the first housing structure 810, the display 830 may not be disposed and a separate sensor region 835 may be disposed. In another embodiment, the sensor region 835 (e.g., a notch region) may be disposed on at least a part of the third surface 821 of the second housing structure 820, or may be disposed to extend to the first surface 811 and the third surface 821.

According to various embodiments, the conductive portion 8131 used as an antenna may be formed using a part (e.g., a lower region) of the first lateral member 813 of the first housing structure 810. In another embodiment, the conductive portion 8131 may be disposed in an upper region of the first housing structure 810 or in a lateral region connecting the upper region and the lower region.

As will be described later, the conductive portion 8131 may include a conductive extended portion (e.g., a conductive extended portion 8132 in FIG. 10) having a predetermined electrical length extended in a direction toward the inner space of the first housing structure 810. According to an embodiment, through the conductive extended portion 8132, the antenna A1 may be configured to operate in a desired frequency band while coping with the slimming of the first housing structure 810.

Figure 10:
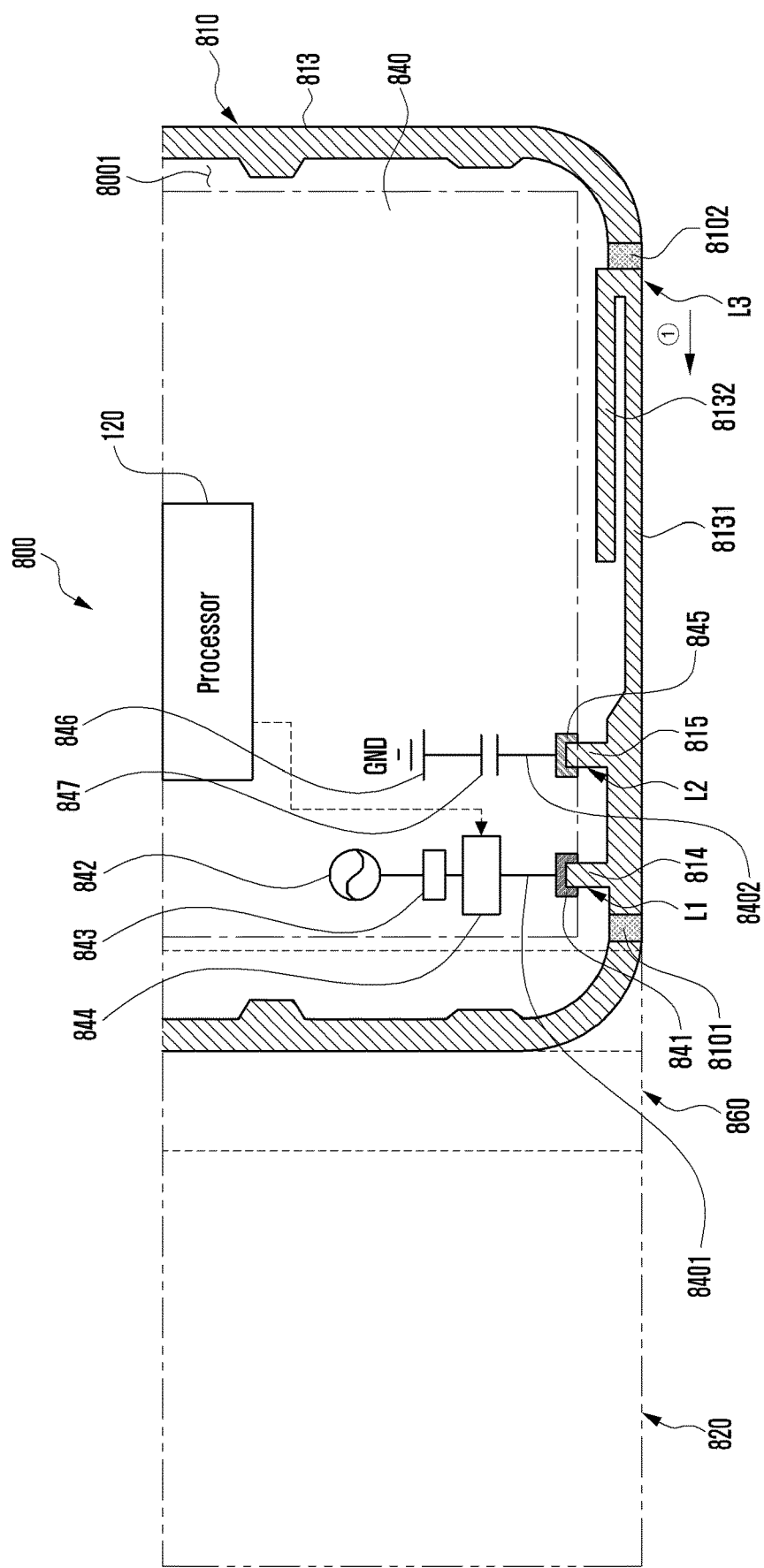
FIG. 10 is a diagram illustrating the arrangement of an antenna in the foldable electronic device of FIG. 8 according to an embodiment of the disclosure.

FIG. 10 is a diagram illustrating the arrangement of an antenna in the foldable electronic device of FIG. 8 according to an embodiment of the disclosure.

Referring to FIG. 10, the first housing structure 810 of the electronic device 800 may include the first lateral member 813. According to an embodiment, the first lateral member 813 may have a first connection piece 814 formed at a first location L1 of the conductive portion 8131 from the first non-conductive portion 8101, and a second connection piece 815 formed at a second location L2. According to an embodiment, the first location L1 may be disposed closer to the first non-conductive portion 8101 than the second location L2. In another embodiment, the first location L1 may be disposed farther from the first non-conductive portion 8101 than the second location L2. According to an embodiment, the first connection piece 814 and the second connection piece 815 may be integrally formed with the conductive portion 8131. According to an embodiment, the first connection piece 814 and the second connection piece 815 may be disposed to be overlapped with at least a part of the printed circuit board 840 disposed in at least a part of the inner space 8001 of the first housing structure 810.

According to various embodiments, the electronic device 800 may include the printed circuit board 840 disposed in the inner space 8001 of the first housing structure 810. According to an embodiment, the printed circuit board 840 may include a first connection part 841 (e.g., a conductive pad) electrically connected to the first connection piece 814. According to an embodiment, the printed circuit board 840 may include a first electrical path 8401 (e.g., a wiring line) connected from the first connection piece 814 to a power feeder 842 (e.g., a wireless communication circuit). According to an embodiment, the power feeder 842 may transmit a signal of a desired frequency band at the first location L1 of the conductive portion 8131 electrically connected through the first electrical path 8401. According to an embodiment, a matching circuit 844 may be disposed on the first electrical path 8401. According to an embodiment, on the first electrical path 8401, an electric shock prevention circuit 843 may be further disposed for preventing electric shock and for electro-static discharge (ESD) because the printed circuit board 840 has a configuration of directly electrical contact with the first lateral member 813 forming the exterior of the first housing structure 810. In another embodiment, the matching circuit 844 may be replaced with a variable element that shifts the operating frequency band through selective switching of a plurality of passive elements.

According to various embodiments, the printed circuit board 840 may include a second connection part 845 (e.g., a conductive pad) electrically connected to the second connection piece 815. According to an embodiment, the printed circuit board 840 may include a second electrical path 8402 (e.g., a wiring line) connected from the second connection part 845 to a ground (GND) 846 of the printed circuit board 840. According to an embodiment, the printed circuit board 840 may include at least one electric shock protection capacitor 847 disposed on the second electrical path 8402.

According to various embodiments, the conductive portion 8131 may include the conductive extended portion 8132 extended from a third location L3 of the end contacting the second non-conductive portion 8102 toward the inner space 8001 of the first housing structure 810. According to an embodiment, the conductive extended portion 8132 may be extended from the end of the conductive portion 8131 in a direction (direction ①) toward the first non-conductive portion 8101 in parallel or non-parallel with the conductive portion 8131. Accordingly, the conductive portion 8131 electrically connected to the power feeder 842 may have an electrical length including the conductive extended portion 8132 extended at a certain length from the end, and may be determined to operate in a desired operating frequency band. For example, the corresponding frequency band may have a range of about 850 MHz to 3000 MHz.

According to various embodiments, when the first surface (e.g., the first surface 811 in FIG. 8) is viewed from above, at least a part of the conductive extended portion 8132 may be disposed so as not to be overlapped with the printed circuit board 840. In another embodiment, when the first surface (e.g., the first surface 811 in FIG. 8) is viewed from above, at least a part of the conductive extended portion 8132 may be disposed so as to be overlapped with the printed circuit board 840. In this case, in order to prevent signal distortion and/or radiation performance degradation due to surrounding conductors, a region of the printed circuit board 840 overlapped with the conductive extended portion 8132 may be formed as a non-conductive region.

According to various embodiments, the conductive extended portion 8132 extended from the conductive portion 8131 may be replaced with at least one of the above-described conductive extended portions 710, 720, 730, and 740 in FIGS. 7A to 7E.

Figure 11A:
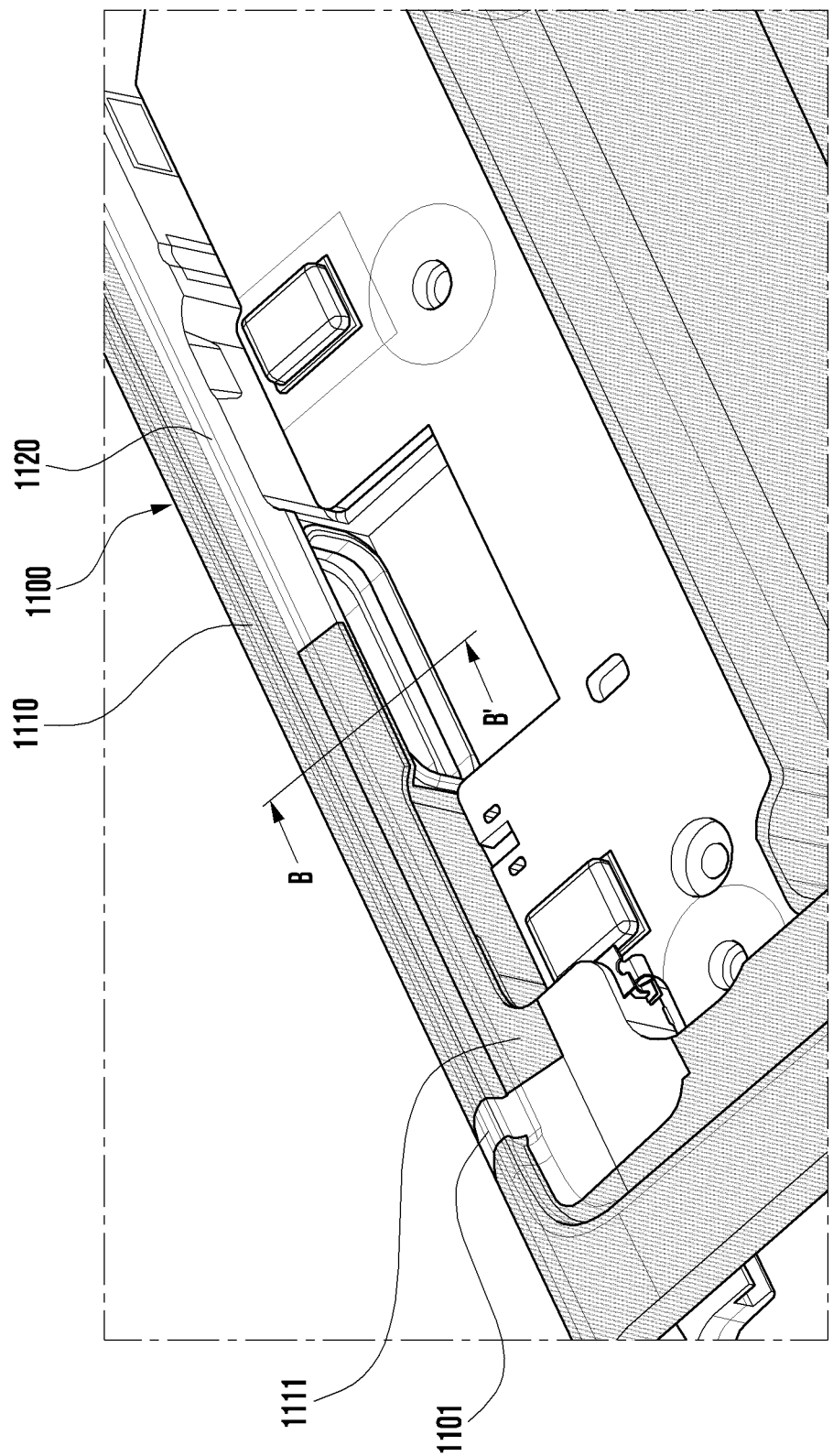
FIG. 11A is a perspective view partially illustrating a lateral member in which a conductive portion and a polymer portion are insert-injected according to an embodiment of the disclosure.
Figure 11B:
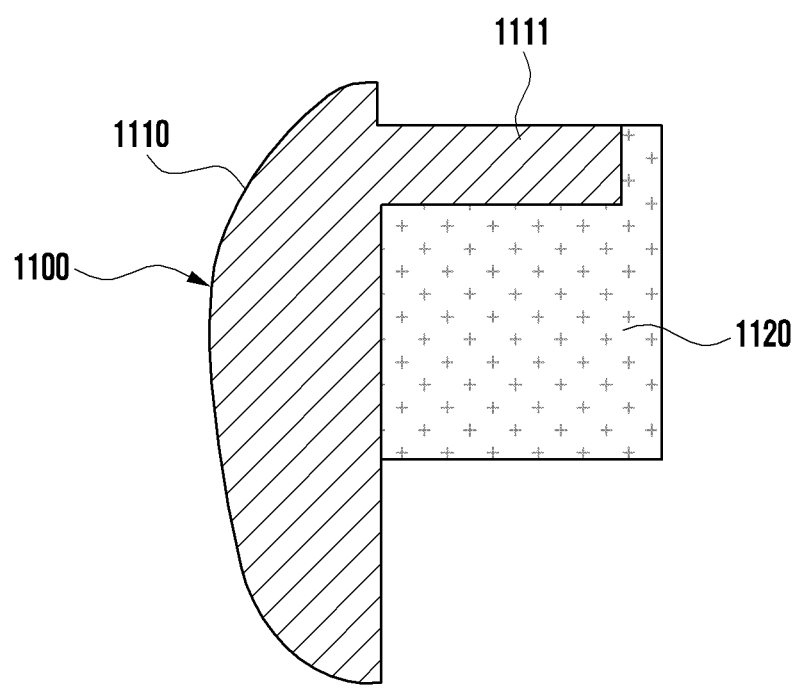
FIG. 11B is a cross-sectional view taken along the line B-B' of FIG. 11A according to an embodiment of the disclosure.
Figure 12A:
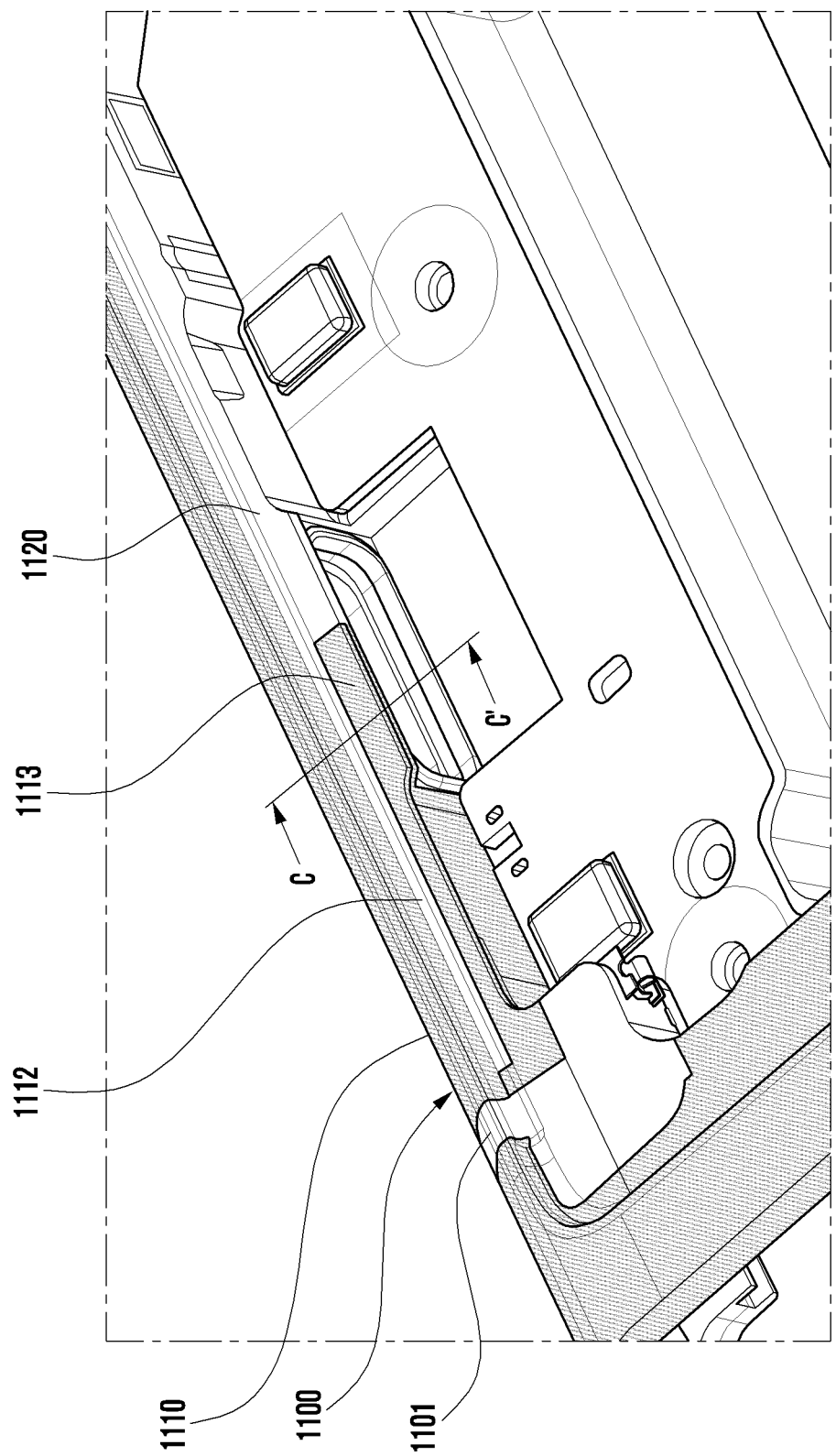
FIG. 12A is a perspective view partially illustrating a state where a conductive extended portion is formed in a lateral member according to an embodiment of the disclosure.
Figure 12B:
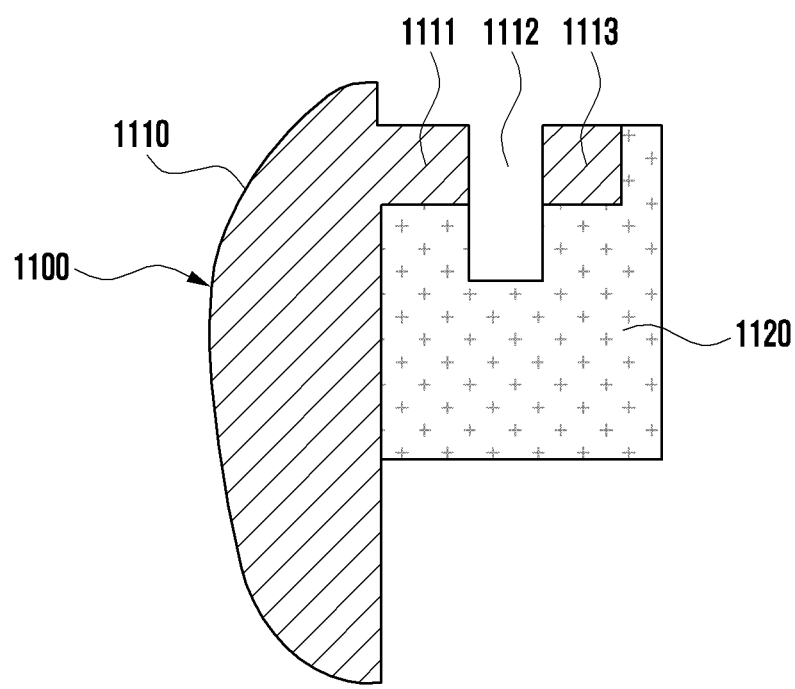
FIG. 12B is a cross-sectional view taken along the line C-C' of FIG. 12A according to an embodiment of the disclosure.

FIG. 11A is a perspective view partially illustrating a lateral member 1100 in which a conductive portion 1110 and a polymer portion 1120 are insert-injected according to an embodiment of the disclosure. FIG. 11B is a cross-sectional view taken along the line B-B' of FIG. 11A according to an embodiment of the disclosure. FIG. 12A is a perspective view partially illustrating a state where a conductive extended portion 1113 is formed in a lateral member 1100 according to an embodiment of the disclosure. FIG. 12B is a cross-sectional view taken along the line C-C' of FIG. 12A according to an embodiment of the disclosure.

The above-described conductive extended portion (e.g., the conductive extended portion 3123 in FIG. 5) should be formed with a slit that is quite narrow from the conductive portion (e.g., the conductive portion 312 in FIG. 5), and should avoid surrounding electronic components (e.g., a USB connector). Therefore, only the insert injection process for the conductive portion and the polymer portion may not completely fill the slit with a polymer member, which may result in a shape defect of the conductive extended portion.

Hereinafter, a method of manufacturing the conductive extended portion 1113 (e.g., the conductive extended portion 3123 in FIG. 5) will be described.

Referring to FIGS. 11A to 12B, the lateral member 1100 may contain the conductive portion 1110 and the polymer portion 1120 through dual injection. According to an embodiment, the conductive portion 1110 may be formed as a unit conductive portion 1110 through at least one non-conductive portion 1101. According to an embodiment, the conductive portion 1110 may include a conductive extension dummy 1111 that is formed to extend in a direction toward the inner space of the lateral member 1100. According to an embodiment, the conductive extension dummy 1111 may be formed to extend from the conductive portion 1110 to at least a part of the polymer portion 1120. According to an embodiment, the conductive extension dummy 1111 may be disposed to be, at least in part, exposed from or embedded in the polymer portion 1120.

According to various embodiments, the conductive extension dummy 1111 insert-injected into the polymer portion 1120 may be cut at least in part to have a predetermined width in a longitudinal direction parallel with the conductive portion 1110, thus resultantly forming the conductive extended portion 1113. According to an embodiment, the conductive extension dummy 1111 may be cut through a milling machine or an NC machine. According to an embodiment, the conductive extension dummy 1111 may be cut to a depth that is greater than the thickness of the conductive extension dummy 1111, so that an electrical isolation state from the conductive portion 1110 may be maintained by a cut portion 1112 except for a portion intentionally connected to the conductive portion 1110.

According to various embodiments, an electronic device (e.g., the electronic device 300 in FIG. 3) may include a housing (e.g., the housing 210 in FIG. 2A) including a front plate (e.g., the front plate 320 in FIG. 3), a rear plate (e.g., the rear plate 380 in FIG. 3) facing opposite to the front plate, and a lateral member (e.g., the lateral member 310 in FIG. 3) surrounding a space (e.g., the space 3001 in FIG. 5) between the front plate and the rear plate, wherein at least a part of the lateral member includes at least one conductive portion (e.g., the conductive portion 312 in FIG. 5) positioned between a first non-conductive portion (e.g., the first non-conductive portion 3104 in FIG. 5) and a second non-conductive portion (e.g., the second non-conductive portion 3105 in FIG. 5) which are spaced apart from each other; a conductive extended portion (e.g., the conductive extended portion 2123 in FIG. 5) extended from at least a part of the conductive portion to the space; a printed circuit board (e.g., the printed circuit board 340 in FIG. 5) disposed in the space; and a wireless communication circuit (e.g., the power feeder 342 in FIG. 5) disposed on the printed circuit board and electrically connected to the conductive portion at a first location (e.g., the first location L1 in FIG. 5) of the conductive portion spaced apart from the first non-conductive portion.

According to various embodiments, the printed circuit board may include a ground (GND), and the first location of the conductive portion may be electrically connected to the ground.

According to various embodiments, the printed circuit board may include a ground (GND) (e.g., the ground 346 in FIG. 5), and the conductive portion may be electrically connected to the ground at a second location (e.g., the second location L2 in FIG. 5) farther from the first non-conductive portion than the first location.

According to various embodiments, the conductive extended portion may be extended into the space from an end (e.g., the third location L3 in FIG. 5) of the conductive portion in contact with the second non-conductive portion.

According to various embodiments, the conductive extended portion may be extended to have a predetermined electrical length (e.g., the electrical length EL in FIG. 5) and a predetermined interval in parallel with the conductive portion in the space.

According to various embodiments, the conductive extended portion may be extended from the conductive portion in a direction toward the second non-conductive portion.

According to various embodiments, the conductive extended portion may be disposed so as not to be overlapped with the printed circuit board when the front plate is viewed from above.

According to various embodiments, the conductive extended portion may be disposed so as to be overlapped, at least in part, with the printed circuit board when the front plate is viewed from above.

According to various embodiments, a region of the printed circuit board overlapped with the conductive extended portion may be formed as a non-conductive region.

According to various embodiments, the conductive extended portion may be branched in a direction toward the space between (e.g., at the fourth location L4 in FIG. 7D) the first location of the conductive portion and the second non-conductive portion.

According to various embodiments, the wireless communication circuit may be configured to transmit and/or receive a signal of at least one frequency band in a range of about 850 MHz to 3000 MHz through the conductive portion and the conductive extended portion.

According to various embodiments, the electronic device may further include a display (e.g., the display 330 in FIG. 3) disposed in the space and disposed to be visible from an outside through at least a part of the front plate.

According to various embodiments, an electronic device (e.g., the electronic device 800 in FIG. 9A) may include a foldable housing including a hinge module (e.g., the hinge structure 860 in FIG. 9A), a first housing (e.g., the first housing structure 810 in FIG. 9A) connected to the hinge module, and including a first surface (e.g., the first surface 811 in FIG. 9A) facing in a first direction, a second surface (e.g., the second surface 812 in FIG. 9A) facing in a direction opposite to the first surface, and a first lateral frame (e.g., the first lateral member 813 in FIG. 9A) surrounding a first space (e.g., the space 8001 in FIG. 10) between the first surface and the second surface, wherein at least a part of the first lateral frame includes a conductive portion (e.g., the conductive portion 8131 in FIG. 9A) positioned between first and second non-conductive portions (e.g., the first and second non-conductive portions 8101 and 8102 in FIG. 9A) spaced apart from each other, and a conductive extended portion (e.g., the conductive extended portion 8132 in FIG. 10) extended from at least a part of the conductive portion into the first space, and a second housing (e.g., the second housing structure 820 in FIG. 9A) connected to the hinge module, and including a third surface (e.g., the third surface 821 in FIG. 9A) facing in a second direction, a fourth surface (e.g., the fourth surface 822 in FIG. 9A) facing in a direction opposite to the third surface, and a second lateral frame (e.g., the second lateral member 823 in FIG. 9A) surrounding a second space between the third surface and the fourth surface, wherein the first housing and the second housing are foldable with respect to each other along the hinge module so that, in a folded state, the first surface faces the third surface and, in an unfolded state, the second direction is identical with the first direction; a printed circuit board (e.g., the printed circuit board in FIG. 10) disposed in the first space; and a wireless communication circuit (e.g., the wireless communication circuit 842 in FIG. 10) disposed on the printed circuit board and electrically connected to the conductive portion at a first location (e.g., the first location L1 in FIG. 10) of the conductive portion spaced apart from the first non-conductive portion.

According to various embodiments, the printed circuit board may include a ground (GND), and the first location of the conductive portion may be electrically connected to the ground.

According to various embodiments, the printed circuit board may include a ground (GND) (e.g., the ground 846 in FIG. 10), and the conductive portion may be electrically connected to the ground at a second location (e.g., the second location L2 in FIG. 10) farther from the first non-conductive portion than the first location.

According to various embodiments, the conductive extended portion may be extended into the space from an end (e.g., the third location L3 in FIG. 10) of the conductive portion in contact with the second non-conductive portion.

According to various embodiments, the conductive extended portion may be extended to have a predetermined electrical length and a predetermined interval in parallel with the conductive portion.

According to various embodiments, the conductive extended portion may be disposed so as not to be overlapped with the printed circuit board when the first surface is viewed from above.

According to various embodiments, the conductive extended portion may be branched in the space between (e.g., at the fourth location L4 in FIG. 7D) the first location of the conductive portion and the second non-conductive portion.

According to various embodiments, the wireless communication circuit may be configured to transmit and/or receive a signal of at least one frequency band in a range of about 850 MHz to 3000 MHz through the conductive portion and the conductive extended portion.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
    a housing including:
        a front plate,
        a rear plate facing in a direction opposite to the front plate,
        a lateral member surrounding a space between the front plate and the rear plate, wherein at least a part of the lateral member includes a conductive portion positioned between a first non-conductive portion and a second non-conductive portion which are spaced apart from each other; and
        a support member integrally extended from the lateral member toward the space and including a conductive part and a polymer portion formed into one body with the conductive part through insert injection;
    a conductive extended portion integrally extended from at least a part of the conductive portion to the space between the front plate and the rear plate;

a printed circuit board disposed in the space between the front plate and the rear plate; and a wireless communication circuit disposed on the printed circuit board and electrically connected to the conductive portion at a first location of the conductive portion spaced apart from the first non-conductive portion, wherein the first non-conductive portion and the second non-conductive portion are extended from the polymer portion, wherein the conductive portion is electrically isolated from the conductive part through the polymer portion, the first non-conductive portion and the second non-conductive portion, and wherein the conductive extended portion is supported by being insert-injected together with the polymer portion in the space.

2. The electronic device of claim 1,
wherein the printed circuit board includes a ground (GND), and
wherein the first location of the conductive portion is electrically connected to the ground.

3. The electronic device of claim 1,
wherein the printed circuit board includes a ground (GND), and
wherein the conductive portion is electrically connected to the ground at a second location farther from the first non-conductive portion than the first location.

4. The electronic device of claim 1, wherein the conductive extended portion is extended into the space between the front plate and the rear plate from an end of the conductive portion in contact with the second non-conductive portion.

5. The electronic device of claim 4, wherein the conductive extended portion is extended to have a predetermined electrical length and a predetermined interval in parallel with the conductive portion in the space between the front plate and the rear plate.

6. The electronic device of claim 4, wherein the conductive extended portion is extended from the conductive portion in a direction toward the second non-conductive portion.

7. The electronic device of claim 1, wherein the conductive extended portion is disposed so as not to be overlapped with the printed circuit board when the front plate is viewed from above.

8. The electronic device of claim 1, wherein the conductive extended portion is disposed so as to be overlapped, at least in part, with the printed circuit board when the front plate is viewed from above.

9. The electronic device of claim 8, wherein a region of the printed circuit board overlapped with the conductive extended portion is formed as a non-conductive region.

10. The electronic device of claim 1, wherein the conductive extended portion is branched in a direction toward the space between the front plate and the rear plate between the first location of the conductive portion and the second non-conductive portion.

11. The electronic device of claim 1, wherein the wireless communication circuit is configured to transmit and/or receive a signal of at least one frequency band in a range of 850 megahertz (MHz) to 3000 MHz through the conductive portion and the conductive extended portion.

12. The electronic device of claim 1, further comprising:
a display disposed in the space between the front plate and the rear plate and disposed to be visible from an outside through at least a part of the front plate.

* * * * *